(12) United States Patent
Desu

(10) Patent No.: US 11,508,905 B2
(45) Date of Patent: *Nov. 22, 2022

(54) RESISTIVE MEMORY DEVICE HAVING AN OXIDE BARRIER LAYER

(71) Applicant: 4DS MEMORY, LIMITED, West Perth (AU)

(72) Inventor: Seshubabu Desu, Fremont, CA (US)

(73) Assignee: 4DS MEMORY, LIMITED, West Perth (AU)

( * ) Notice: Subject to any disclaimer, the term of this patent is extended or adjusted under 35 U.S.C. 154(b) by 45 days.

This patent is subject to a terminal disclaimer.

(21) Appl. No.: 17/195,310

(22) Filed: Mar. 8, 2021

(65) Prior Publication Data
US 2021/0193919 A1 Jun. 24, 2021

Related U.S. Application Data

(63) Continuation of application No. 16/546,109, filed on Aug. 20, 2019, now Pat. No. 10,950,788.

(51) Int. Cl.
*H01L 45/00* (2006.01)
*H01L 27/24* (2006.01)

(52) U.S. Cl.
CPC ...... *H01L 45/1246* (2013.01); *H01L 27/2463* (2013.01); *H01L 45/08* (2013.01); *H01L 45/1233* (2013.01); *H01L 45/147* (2013.01); *H01L 45/16* (2013.01)

(58) Field of Classification Search
CPC . H01L 27/2463; H01L 45/1246; H01L 45/08; H01L 45/1233; H01L 45/147; H01L 45/16

USPC .......................................................... 257/5
See application file for complete search history.

(56) References Cited

U.S. PATENT DOCUMENTS

| 10,319,907 | B1 | 6/2019 | Desu |
| 10,950,788 | B1 | 3/2021 | Desu |
| 2017/0288140 | A1* | 10/2017 | Karpov ............... H01L 27/2436 |
| 2018/0219154 | A1 | 8/2018 | Majhi et al. |
| 2019/0288197 | A1 | 9/2019 | Desu |

OTHER PUBLICATIONS

Non-Final Office Action dated Oct. 29, 2020 from U.S. Appl. No. 16/546,109, 8 pages.
Notice of Allowance dated Jan. 27, 2021 from U.S. Appl. No. 16/546,109, 8 pages.

* cited by examiner

*Primary Examiner* — Igwe U Anya
(74) *Attorney, Agent, or Firm* — Kilpatrick Townsend & Stockton LLP

(57) ABSTRACT

A memory device is disclosed. The memory device includes a bottom contact, and a memory layer connected to the bottom contact, where the memory layer has a variable resistance. The memory device also includes a top electrode on the memory layer, where the top electrode and the memory layer cooperatively form a heterojunction memory structure. The memory device also includes a top contact on the top electrode, and a first barrier layer, including a first oxide material and a second oxide material, where the first oxide material is different from the second oxide material, and where the first barrier layer is between one of A) the memory layer and the bottom contact, and B) the top electrode and the top contact, where the first barrier layer is configured to substantially prevent the conduction of ions or vacancies therethrough.

26 Claims, 4 Drawing Sheets

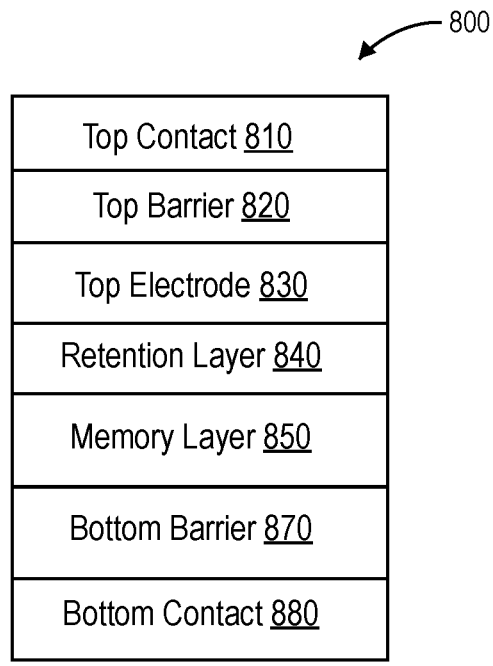
FIG. 8
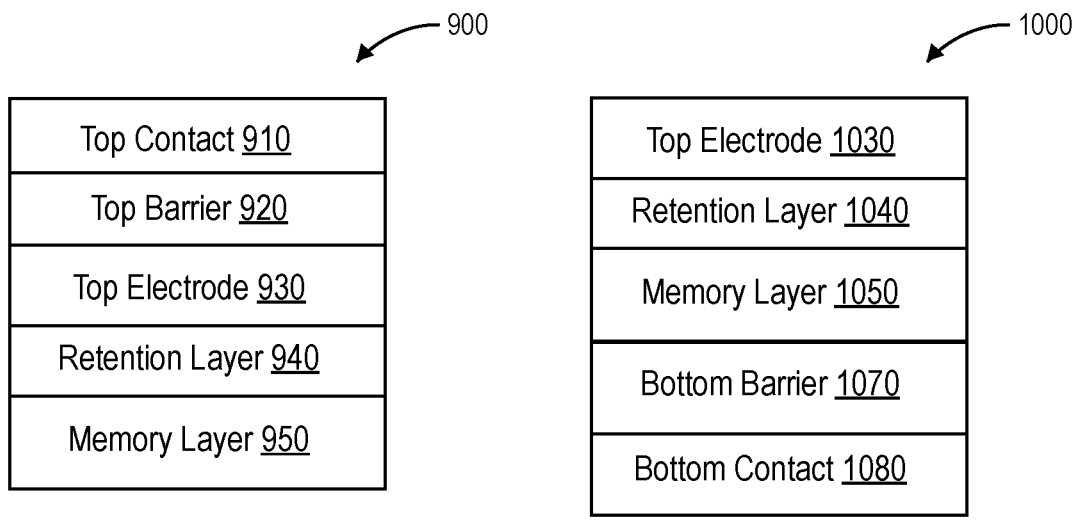
FIG. 9
FIG. 10

RESISTIVE MEMORY DEVICE HAVING AN OXIDE BARRIER LAYER

CROSS-REFERENCES TO RELATED APPLICATIONS

This application is a continuation of U.S. application Ser. No. 16/546,109 entitled "A RESISTIVE MEMORY DEVICE HAVING AN OXIDE BARRIER LAYER," and filed on Aug. 20, 2019, the entirety of which is hereby incorporated by reference herein.

FIELD OF THE INVENTION

The present invention relates generally to nonvolatile memory devices, and more particularly to memory devices having effective speed comparable to DRAM, which do not require speed-crippling error correction and include hetero junctions of oxide materials.

BACKGROUND OF THE INVENTION

In general, memory devices or systems can be segmented in 3 distinct categories: internet-of-things (IoT) memories, embedded memories, and high-density high-volume memories. The memory requirements (cost, density, speed, endurance, retention, power consumption) are quite different for each of these 3 categories.

IoT memories tend to be inexpensive, power-efficient, and low-density. Memories embedded in complex system chips tend to be fast, area-efficient, and medium-density. High-density high-volume memories must be scalable to small geometries to be cost effective.

The high-density high-volume memory category is currently dominated by DRAM (which is volatile) and NAND Flash (which is non-volatile).

DRAM is very-fast, exhibits exceptional endurance, and is therefore best suited for fast system memory. DRAM, however, is expensive and volatile (for example, the data may need to be refreshed every 60 milliseconds) and sacrifices retention to maximize speed and endurance.

In sharp contrast, NAND Flash is inexpensive with much higher bit capacity and good retention, and is best suited for low-cost silicon storage. NAND Flash, however, sacrifices both speed and endurance to maximize retention.

Being limited to two dimensions (2D), DRAM will likely remain expensive since silicon area largely defines cost per gigabyte. In contrast, the cost of NAND Flash is expected to decline over time because of three dimensional (3D) stacking. The cost gap between DRAM and NAND Flash will likely increase over time.

DRAM and NAND Flash fit their sweet spots near perfectly and it seems highly unlikely that a universal memory combining the best of DRAM and NAND Flash will ever exist. It is equally unlikely that any emerging memory technology will replace DRAM because its speed and endurance combination is exceptionally hard to beat. Furthermore, there is no economic justification to build a NAND Flash replacement for high-density applications while NAND Flash prices continue to decrease.

However, as data processing and storage needs continue their rapid increase for mobile devices and cloud data centers, the industry needs a new non-volatile memory with attributes much closer to DRAM (because it is impossible to replace) than to NAND Flash (because it does not need to be replaced).

This vast space between DRAM and NAND Flash is therefore an opportunity for innovation.

Storage Class Memory is an emerging non-volatile memory segment positioned between the most successful system memory (DRAM) and the most successful silicon storage (NAND Flash). There are many opportunities for new memories in the vast space between DRAM and NAND Flash, each with different speed, endurance and retention metrics.

The biggest opportunities are always where the difficulty is greatest and that is in the space closest to DRAM. The ultimate market demand is therefore for Storage Class Memory with DRAM speed, the highest endurance achievable with this speed, a cost per gigabyte closer to NAND Flash, and a pragmatic retention far superior to DRAM retention.

Furthermore, certain semiconductor memory technologies have applied a principal of geometric redundancy, where multiple data bits may be stored in a single cell. This property of a memory cell to support a multiple of values is sometimes referred to as its dynamic range. To date the for memory cells have abilities to support a dynamic range anywhere between 1 and 4 bits. These combined properties of semiconductors have increased capacities and reduced costs.

Another issue associated with semiconductor memory manufacturing has been the substantial costs of the semiconductor foundries which can be more than a billion dollars to establish. Amortizing expenses increase the cost of memory chips. Now, with advances in foundry resolutions enabling smaller cell sizes and the geometric redundancy of multiple bit-level per memory cell semiconductor memory is actually cheaper per unit cost, and substantially more rugged in terms of high G forces than memory files on a disk drive.

In Flash memories, there have been improvements, but they have become susceptible to write cycle limitations and ability to support dynamic ranges are diminished as the quantum limit is approached. Another issue with Flash memory is its limitations in write speeds and the number of write cycle limitations the cell will tolerate before it permanently fails.

Accordingly, what is desired is a memory system and method which overcomes the above-identified problems. The systems and methods should be easily implemented, cost effective, and adaptable to existing storage applications.

BRIEF SUMMARY OF THE INVENTION

One inventive aspect is a memory device. The memory device includes a bottom contact, and a memory layer connected to the bottom contact, where the memory layer has a variable resistance. The memory device also includes a top electrode on the memory layer, where the top electrode and the memory layer cooperatively form a heterojunction memory structure. The memory device also includes a top contact on the top electrode, and a first barrier layer, including a first oxide material and a second oxide material, where the first oxide material is different from the second oxide material, and where the first barrier layer is between one of A) the memory layer and the bottom contact, and B) the top electrode and the top contact, where the first barrier layer is configured to substantially prevent the conduction of ions or vacancies therethrough.

In some embodiments, the first barrier layer has a resistivity of less than 1 m Ohm-cm.

In some embodiments, the first barrier layer has a diffusion constant of oxygen ions of less than about $1 \times 10^{-10}$ cm$^2$/s.

In some embodiments, a contact is formed at an interface between the first barrier layer and at least one of the memory layer, the bottom contact, the top electrode, and the top contact, where the first barrier layer is not donate oxygen ions through the contact, and where the first barrier layer does not accept oxygen ions through the contact.

In some embodiments, a contact formed at an interface between the first barrier layer and at least one of the memory layer, the bottom contact, the top electrode, and the top contact is ohmic.

In some embodiments, a contact formed at an interface between the first barrier layer and at least one of the memory layer, the bottom contact, the top electrode, and the top contact resistance of the contact is less than about 1e-11 Ohm m$^2$.

In some embodiments, the first oxide material includes an oxide of a noble metal and the second oxide material includes an oxide of a transition metal.

In some embodiments, the first oxide material has a first crystalline lattice structure and the second oxide material as a second crystalline lattice structure, where the first and second crystalline lattice structures are different.

In some embodiments, the memory device further includes a template layer between the bottom contact and the memory layer, where a crystalline structure of the memory layer matches a crystalline structure of the template layer.

In some embodiments, the memory device further includes a retention layer between the memory layer and the top electrode, where the retention layer has a variable ionic conductivity, and is configured to selectively resist ionic conduction.

In some embodiments, the memory device further includes a second barrier layer, including a third oxide material and a fourth oxide material, where the third oxide material is different from the fourth oxide material, and where the second barrier layer is between the other of A) the memory layer and the bottom contact, and B) the top electrode and the top contact, where the second barrier layer is configured to substantially prevent the conduction of ions or vacancies therethrough.

In some embodiments, the memory device further includes a side barrier layer, where the first and second barrier layers and the side barrier layer define an enclosed space, where the top electrode and the memory layer are within the space, and where ions of the top electrode and the memory layer are confined to the space by the first and second barrier layers and the side barrier layer.

Another inventive aspect is a method of manufacturing a memory device. The method includes forming a bottom contact, and connecting a memory layer to the bottom contact, where the memory layer has a variable resistance. The method also includes forming a top electrode on the memory layer, where the top electrode and the memory layer cooperatively form a heterojunction memory structure. The method also includes forming a top contact on the top electrode, and forming a first barrier layer, configured to substantially prevent the conduction of ions or vacancies therethrough, where the first barrier layer is between one of A) the memory layer and the bottom contact, and B) the top electrode and the top contact.

In some embodiments, the first barrier layer has a resistivity of less than 1 m Ohm-cm.

In some embodiments, the first barrier layer has a diffusion constant of oxygen ions of less than about $1 \times 10^{-10}$ cm$^2$/s.

In some embodiments, a contact is formed at an interface between the first barrier layer and at least one of the memory layer, the bottom contact, the top electrode, and the top contact, where the first barrier layer is not donate oxygen ions through the contact, and where the first barrier layer does not accept oxygen ions through the contact.

In some embodiments, a contact formed at an interface between the first barrier layer and at least one of the memory layer, the bottom contact, the top electrode, and the top contact is ohmic.

In some embodiments, a contact formed at an interface between the first barrier layer and at least one of the memory layer, the bottom contact, the top electrode, and the top contact resistance of the contact is less than about 1e-11 Ohm m$^2$.

In some embodiments, the first oxide material includes an oxide of a noble metal and the second oxide material includes an oxide of a transition metal.

In some embodiments, the first oxide material has a first crystalline lattice structure and the second oxide material as a second crystalline lattice structure, where the first and second crystalline lattice structures are different.

In some embodiments, the method further includes forming a template layer between the bottom contact and the memory layer, where the crystalline structure of the memory layer matches the crystalline structure of the template layer.

In some embodiments, the method further includes forming a retention layer between the memory layer and the top electrode, where the retention layer has a variable ionic conductivity, and is configured to selectively resist ionic conduction.

In some embodiments, the method further includes forming a second barrier layer, including a third oxide material and a fourth oxide material, where the third oxide material is different from the fourth oxide material, and where the second barrier layer is between the other of A) the memory layer and the bottom contact, and B) the top electrode and the top contact, where the second barrier layer is configured to substantially prevent the conduction of ions or vacancies therethrough.

In some embodiments, the method further includes forming a side barrier layer, where the first and second barrier layers and the side barrier layer define an enclosed space, where the top electrode and the memory layer are within the enclosed space, and where ions of the top electrode and the memory layer are confined to the enclosed space by the first and second barrier layers and the side barrier layer.

BRIEF DESCRIPTION OF THE DRAWINGS

FIG. 8 is a schematic illustration of a memory device according to an embodiment.

FIG. 9 is a schematic illustration of a memory device according to an embodiment.

FIG. 10 is a schematic illustration of a memory device according to an embodiment.

DETAILED DESCRIPTION OF THE INVENTION

Figure 1:
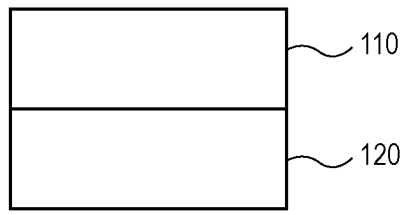
FIG. 1 is a schematic diagram of a contact between an oxide and a conductive amorphous oxide material.

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Certain oxide materials and their characteristics and attributes are discussed below. In addition, certain applications of the oxide materials are described below. Neither the materials nor the applications thereof are to be limited by this disclosure, as various alternative materials and applications may be made by those of ordinary skill in the art in light of and using the features discussed in this disclosure.

The oxide materials discussed herein have an amorphous structure formed by at least two different oxides AOx and BOx, where A and B are elements or groups. One or both of AOx and BOx may be crystalline, however, the composite material AOxBOx is a nano-level mixture, not a compound, and is amorphous or nearly amorphous or substantially amorphous.

For example, in some embodiments, any crystal grains formed by individual constituents AOx and BOx are small enough that the substantive effect of the composite material AOxBOx in its application is as if the composite material AOxBOx were amorphous. For example, the composite material AOxBOx may have substantially no ionic conductivity. In some embodiments, the grains of the individual constituents AOx and BOx may be less than about 10 nm, about 9 nm, about 8 nm, about 7 nm, about 6 nm, about 5 nm, about 4 nm, about 3 nm, about 2 nm, about 1 nm, about 0.9 nm, about 0.8 nm, about 0.7 nm, about 0.6 nm, about 0.5 nm, about 0.4 nm, or about 0.3 nm.

Alternatively or additionally, crystal structures of the individual constituents AOx and BOx may be different. Consequently, adjacent grains of individual constituents AOx and BOx do not and cannot form a continuous lattice crystalline structure across their mutual boundary.

Alternatively or additionally, the individual constituents AOx and BOx are mutually insoluble. Therefore, the individual grains of the AOx and BOx constituents contact one another without intermixing.

At least partly because of these properties, when the oxide materials discussed herein are deposited on a substrate, for example with a sputtering process, separate phases of the composite material AOxBOx do not or substantially do not form.

A and B elements may, for example, include Ru, Rh, Pd, Re, Ir, Pt, or other noble metals, as understood by those of skill in the art. For example, some other metals having low affinity for oxygen as compared to yet other metals are considered noble metals by those of skill in the art. A and B elements may, for example, include Ti, Zr, Hf, Nb, Ta, Si, Al, Ga, or other transition metals, as understood by those of skill in the art. For example, some other elements are considered transition metals by those of skill in the art. In some embodiments, other elements or groups are used to form the AOx or BOx constituents. For example, other similar elements or groups are used to form the AOx or BOx constituents.

In some embodiments, the AOx and BOx constituents are both conductive. In some embodiments, one of the AOx and BOx constituents is conductive. In such embodiments, the conductive constituent forms conductive one or more paths through the AOxBOx composite material.

All combinations of the AOx and BOx individual constituents are contemplated and included herein as embodiments of the composite material AOxBOx. In addition, composite materials AOxBOx having any combination of the properties discussed herein are contemplated and included herein as embodiments.

In some embodiments, the AOxBOx composite material is conductive or substantially conductive. For example, the AOxBOx composite material may have resistivity less than $1 \times 10^{-3}$ Ohm-cm.

In some embodiments, the AOxBOx composite material is transparent or substantially transparent to a bandwidth of electromagnetic radiation. For example, the AOxBOx composite material may absorb less than 10% of visible light transmitted therethrough.

In some embodiments, the AOxBOx composite material is opaque or substantially opaque to a bandwidth of electromagnetic radiation.

In some embodiments, the AOxBOx composite material is fully oxidized or substantially fully oxidized. Accordingly, when in contact with another material the AOxBOx composite material does not donate to or accept oxygen ions from the other material. For example, the amount, if any, of oxygen ions which migrate from the other material to the AOxBOx composite material causes no substantial difference in one or more of the electrical, mechanical, and chemical behavior of the other material.

In some embodiments, the AOxBOx composite material prevents or substantially prevents oxygen ion conduction therethrough. For example, the diffusion constant of oxygen ions may be less than about $1 \times 10^{-10}$ cm$^2$/s, less than about $1 \times 10^{-11}$ cm$^2$/s, or less than about $1 \times 10^{-12}$ cm$^2$/s.

In some embodiments, the AOxBOx composite material may be deposited on a substrate at temperatures sufficiently low that the material does not chemically react with the substrate. For example, the AOxBOx composite material may be deposited at room temperature or at about room temperature.

Accordingly, in some embodiments, when the AOxBOx composite material is deposited, the AOxBOx composite material does not donate or accept oxygen to or from the substrate material. As a result, the properties of the substrate material significant for the application, as understood by those of skill in the art, are not altered by the presence, proximity, or contact of the AOxBOx composite material. For example, the amount, if any, of oxygen ions which migrate to or from the substrate material from or to the AOxBOx composite material causes no substantial difference in one or more of the electrical, mechanical, and chemical behavior of the substrate material or of the AOxBOx composite material. In some embodiments, no or substantially no transition layer is formed.

In some embodiments, the AOxBOx composite material may be deposited on a substrate with a reactive sputtering process. A single target comprising both A and B elements or groups may be used in an atmosphere comprising oxygen. Alternatively, a first target comprising the A element or group and a second target comprising the B element or group may be used in the atmosphere comprising oxygen.

The temperature during the deposition may be, for example, about room temperature. Higher temperatures may also be used. For example, temperatures less than about 50 C, about 100 C, about 150 C, about 200 C, about 250 C, or about 300 C may be used.

The deposition pressure may be, for example, about 0.1 m Torr, about 10 m Torr, or between about 0.1 m Torr and about 10 m Torr.

During the deposition, the oxygen partial pressure may be, for example, about 2%, about 20%, or between about 2% and about 20%.

During the deposition, the RF power may be, for example, about 0.1 W/cm$^2$, about 10 W/cm$^2$, or between about 0.1 W/cm$^2$ and about 10 W/cm$^2$.

Other deposition processes may be used, as understood by those of skill in the art. For example, any of the following processes may be used: Pulsed Laser deposition, Chemical Vapor deposition, Molecular Beam Epitaxy deposition, and Atomic Layer deposition. In some embodiments, solution deposition techniques may be used, such as Sol-gel and Metal-Organic deposition. As understood by those of ordinary skill in the art, other deposition techniques may be used.

In some applications, an AOxBOx material is formed on a substrate to create an electrical contact between the AOxBOx material and the substrate material. In some embodiments, the contact is Ohmic or substantially Ohmic. In some embodiments, the contact forms a Schottky barrier. As understood by those of skill in the art, the A and B elements or groups used for the AOxBOx material, the specific constitution of the AOxBOx material, and the material of the substrate determine whether the contact is Ohmic, substantially Ohmic, or forms a Schottky barrier.

FIG. 1 is a schematic diagram of an ohmic contact between a material 120 and a conductive amorphous AOxBOx material 110. The contact between material 120 and AOxBOx material 110 forms an ohmic contact having properties of ohmic contacts, as understood by those of skill in the art. FIG. 1 illustrates an embodiment of a particular application of a contact formed with AOxBOx materials. Numerous other applications are also contemplated. Some, but not all of these other applications are discussed elsewhere herein.

For example, the ohmic contact may have current vs. voltage linearity properties identifiable by one of skill in the art as being characteristic of an ohmic contact. In some embodiments, the ohmic contact is non-rectifying, and may be characterized by a linear or substantially linear current vs. voltage curve. The ohmic contact may have low resistivity. For example, the contact may have a contact resistance which is less than about 1e-11 Ohm m$^2$, about 1e-12 Ohm m$^2$, about 1e-13 Ohm m$^2$, or about 1e-14 Ohm m$^2$. The contact, may, for example, be identified as being ohmic by one of skill in the art as a result of parameters of the material 120 and AOxBOx material 110, such as Fermi level being substantially equal.

In any embodiment or application, a noble metal layer may be formed between the material 120 and the AOxBOx material 110. In such embodiments or applications, a first ohmic contact may be formed between the AOxBOx material 110 and the noble metal layer. Additionally or alternatively, a second ohmic contact may be formed between the material 120 and the noble metal layer.

The material 120 may, for example, comprise a conductive oxide. For example, material 120 may comprise one or more of: $InO_x$, ZnO, $GaO_x$, $SnO_x$, $(InGa)O_x$, $(ZnGa)O_x$, $(InZnGa)O_x$, $BaSnO_3$, and ITO, as understood by those of skill in the art. Other conductive oxides, as understood by those of skill in the art, may be used.

The material 120 may comprise a semiconductor or semiconducting oxide, for example, having a conductivity which may be electrically, chemically, or mechanically controlled or modified, as understood by those of skill in the art. For example, material 120 may comprise one or more of: $InO_x$, ZnO, $GaO_x$, $SnO_x$, $(InGa)O_x$, $(ZnGa)O_x$, $(InZnGa)O_x$, GaN, AlN as understood by those of skill in the art. Other semiconductors and semiconductor oxides, as understood by those of skill in the art, may be used.

The material 120 may comprise an insulative oxide. For example, material 120 may comprise one or more of: $ZrO_2$, doped $ZrO_2$, $BaTiO_3$, $SrTiO_3$, as understood by those of skill in the art. Other insulative oxides, as understood by those of skill in the art, may be used.

The material 120 may comprise a non-oxide conductive metal material. For example, material 120 may comprise one or more of: Al, Pt, Cu, Au, Ag, W, Ti, and Ta, as understood by those of skill in the art. Other non-oxide conductive metal materials, as understood by those of skill in the art, may be used.

The material 120 may comprise a non-oxide conductive noble metal material. For example, material 120 may comprise one or more of: Ru, Rh, Pd, Ag, Os, Ir, Pt, and Au, as understood by those of skill in the art. Other non-oxide conductive noble metal materials, as understood by those of skill in the art, may be used.

The material 120 may comprise another non-oxide conductive material. For example, material 120 may comprise one or more of: TiN, TaN, $TiAlN_x$, and $TaAlN_x$, as understood by those of skill in the art. Other non-oxide conductive materials, as understood by those of skill in the art, may be used.

The material 120 may comprise a oxide or non-oxide semiconductor material, for example, having a conductivity which may be electrically, chemically, or mechanically controlled or modified, as understood by those of skill in the art. For example, material 120 may comprise one or more of: or $(PrCa)MnO_3$, $(Sm1-xCax)MnO_3$, and $(La1-xSrx)MnO_3$, GaN, AlN as understood by those of skill in the art. Other non-oxide semiconductor materials, as understood by those of skill in the art, may be used.

The material 120 may comprise a non-oxide insulative material. For example, material 120 may comprise one or more of: Sift, and $Ta_2O_5$, as understood by those of skill in the art. Other non-oxide insulative materials, as understood by those of skill in the art, may be used.

Material 120 may be a single material, multiple materials, or may be a solid solution of multiple materials.

The AOxBOx material 110 may have any of the properties of the AOxBOx materials discussed elsewhere herein.

FIGS. 2-10 illustrate schematic examples of embodiments of memory devices having barrier layers which may be formed of an AOxBOx material having properties similar or identical to properties of AOxBOx material 110. For example, in the embodiments of FIGS. 2-10, barrier layers formed of an AOxBOx material may form ohmic contacts with any or all of the layers adjacent thereto. As understood by those of skill in the art, numerous other embodiments are contemplated.

Figure 2:
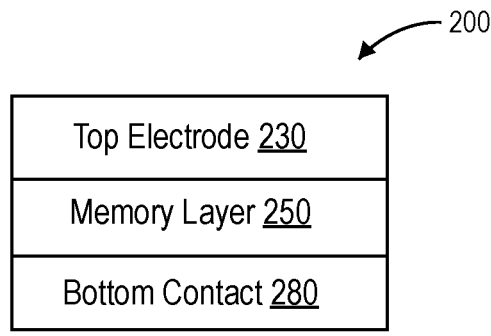
FIG. 2 is a schematic illustration of a memory device according to an embodiment.

FIG. 2 is an illustration of a memory device 200 which includes a conductive bottom contact 280, which is coupled to a memory layer 250. The memory layer 250 is coupled to a top electrode layer 230, and the top electrode layer 230 is coupled to a top contact 110.

The conductive bottom contact 280 may, for example, comprise Platinum (Pt). The memory layer 250 may, for example comprise Praseodymium Calcium Manganese Oxide (PCMO). Top electrode layer 230 is formed with a material which forms a secure bond with the memory layer 250. Top contact 210 forms an electrical connection between the memory device 200 and other electrical components. Top contact 210 may also be used to form a mechanical connection between the memory device 200 and another device.

Top electrode layer 230 cooperatively forms a metal oxide heterojunction memory cell with memory layer 250, and is configured to accept or donate oxygen ions or vacancies from or to memory layer 250 in response to an electric field applied across the electrode layer 230 and the memory layer 250. In some embodiments, the top electrode layer 230 may be oxygen-rich and may cooperatively form an oxygen ion heterojunction memory cell with memory layer 250. In alternative embodiments, the top electrode layer 230 may be oxygen depleted and may cooperatively form an oxygen vacancy heterojunction memory cell with memory layer 250.

As understood by those of skill in the art, the resistivity of the memory layer 250 is dependent on the concentration of oxygen ions or vacancies therein. Therefore, memory device 200 functions as a rewritable memory cell, where the state of the memory device corresponds with the resistivity of the memory layer 250. The memory layer 250 is written by applying a voltage to induce an electric field to force the concentration of the oxygen ions or vacancies to a desired concentration state, and the desired concentration state corresponds with a desired resistivity state. As a result, the resistance of the memory layer is programmed by the write operation. To read the state of the memory cell, a voltage or a current may be applied to the cell. A current or voltage generated in response to the applied voltage or current is dependent on the resistance state of the memory cell, and may be sensed to determine the resistance state.

Figure 3:
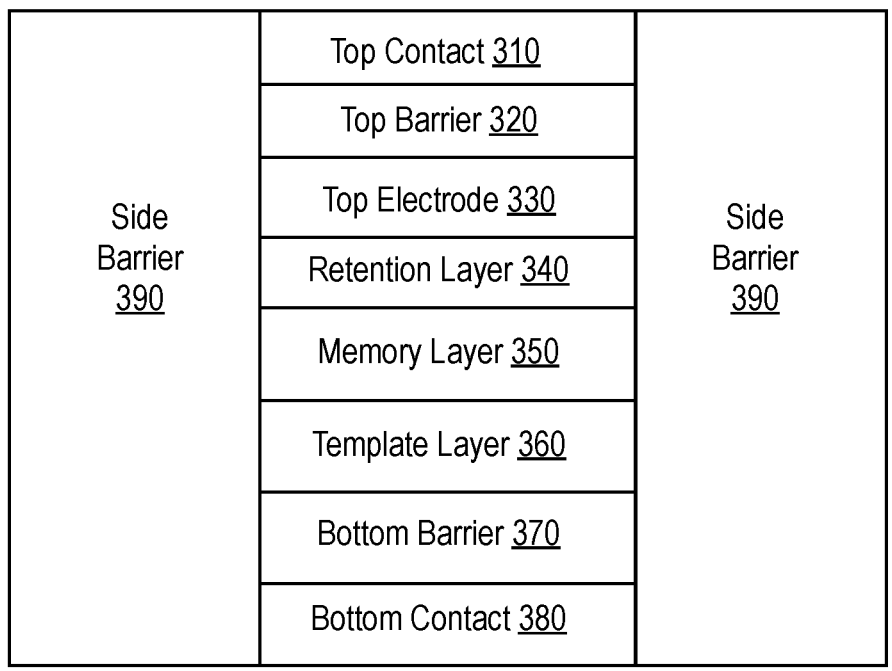
FIG. 3 is a schematic illustration of a memory device according to an embodiment.

FIG. 3 is a schematic illustration of a memory device 300 according to an embodiment. Memory device 300 includes bottom contact 380, conductive bottom barrier layer 370, template layer 360, memory layer 350, optional retention layer 340, top electrode layer 330, top barrier layer 320, top contact 310, and side barrier layer 390. In some embodiments, side barrier layer 390 is substantially annular and surrounds bottom contact 380, conductive bottom barrier layer 370, template layer 360, memory layer 350, retention layer 340 (if present), top electrode layer 330, top barrier layer 320, and top contact 310.

Memory device 300 may be formed by forming bottom contact 380, forming conductive bottom barrier layer 370 on bottom contact 380, forming template layer 360 on conductive bottom barrier layer 370, forming memory layer 350 on template layer 360, optionally forming retention layer 340 on memory layer 350, forming top electrode layer 330 on retention layer 340 or on memory layer 350, forming top barrier layer 320 on top electrode layer 330, forming top contact 310 on top barrier layer 320, and forming side barrier layer 390 on both lateral sides of each of bottom contact 380, conductive bottom barrier layer 370, template layer 360, memory layer 350, retention layer 340 (if present), top electrode layer 330, top barrier layer 320, and top contact 310.

In some embodiments, each of the interfaces of the various layers of memory device 300 forms an ohmic contact between the layers.

In some embodiments, top contact 310 includes at least one of Copper (Cu), Aluminum (Al), Tungsten (W), Ruthenium (Ru), Platinum (Pt), Iridium (Ir), and Rhodium (Rh). In alternative embodiments, one or more other materials are used.

Top contact 310 is used to form an electrical connection between the memory device 300 and other electrical components. Top contact 300 may also be used to form a mechanical connection between the memory device 300 and another device.

In some embodiments, top barrier layer 320 includes at least one of Titanium Nitride (TiN), Tantalum Nitride (TaN), Titanium Aluminum Nitride (TiAlN), Tantalum Aluminum Nitride (TaAlN), Titanium Silicon Nitride (TiSiN), Tantalum Silicon Nitride (TaSiN), and Titanium Tungsten (TiW). In alternative embodiments, one or more other materials are used.

The top barrier layer 320 may comprise an AOxBOx material having any of the properties of the AOxBOx materials discussed elsewhere herein. In some embodiments, top barrier layer 320 comprises first and second layers, where the first layer comprises an AOxBOx material having any of the properties of the AOxBOx materials discussed elsewhere herein, and the second layer comprises a noble metal. In some embodiments, top barrier layer 320 comprises first, second, and third layers, where the first layer comprises a noble metal, the second layer comprises an AOxBOx material having any of the properties of the AOxBOx materials discussed elsewhere herein, and the third layer comprises a noble metal, and where the second layer is between the first and third layers.

Top barrier layer 320 may be formed of a material having a band gap wider than that of one or more of the top electrode layer 330, any retention layer 340, and the memory layer 350. Top barrier layer 320 is configured to substantially prevent the conduction of oxygen ions or vacancies during operation of the memory device 300. Accordingly, top barrier layer 320 substantially prevents oxygen ions or vacancies from escaping from the top electrode layer 330 into the top barrier layer 320. In addition, top barrier layer 320 is configured to conduct electrical current between the top electrode layer 330 and the top contact 310. For example, top barrier layer 320 may have a resistivity less than $1 \times 10^{-4}$ ohm-m.

The top barrier layer 320 may be formed using any deposition process, such as PVD, CVD, sputtering, evaporation, ALD, or another deposition or growth process. Furthermore, in some embodiments, top barrier layer 320 experiences substantially no chemical reaction with the top electrode 330, such that the characteristics of the top barrier layer 320 and the top electrode 330 remain substantially unaffected by one another. Also, in some embodiments, substantially no diffusion occurs between the top barrier layer 320 and the top electrode 330, such that the characteristics of the memory layer 350 and the retention layer 340 remain substantially unaffected by one another.

In some embodiments, top electrode layer 330 includes at least one of Tungsten (W), Molybdenum (Mo), Nickel (Ni), Iron (Fe), Cobalt (Co), and Chromium (Cr). In alternative embodiments, one or more other materials are used. For example, another metal, conductive oxide, or other conductive compound may be use.

Top electrode layer 330 forms an electrical connection between the retention layer 340 or the memory layer 350 and the top barrier layer 320. Top electrode layer 330 is formed with a material which forms a secure bond with the retention layer 340 or the memory layer 350.

Top electrode layer 330 cooperatively forms a metal oxide heterojunction memory with memory layer 350, and is configured to accept or donate oxygen ions or vacancies from or to memory layer 350 in response to an electric field applied across the electrode layer 330 and the memory layer 350. In some embodiments, the top electrode layer 330 may be oxygen-rich and may cooperatively form an oxygen ion heterojunction memory cell with memory layer 350. In alternative embodiments, the top electrode layer 330 may be oxygen depleted and may cooperatively form an oxygen vacancy heterojunction memory cell with memory layer 350.

In some embodiments, optional retention layer 340 includes at least one of SnOx, InOx, (IN,SN)Ox, and doped ZnO. In alternative embodiments, one or more other materials are used.

In some embodiments, retention layer 340 has high electrical conductivity. For example, retention layer 340 may have a resistivity less than $1 \times 10^{-4}$ ohm-m. Retention layer 340 may also be selectively resistant to conduction of oxygen ions and vacancies in response to an applied electric field. In addition, voltage dependence of the ionic conductivity of retention layer 340 may be highly non-linear. Furthermore, retention layer 340 may experience no chemical interaction with the top electrode layer 330 and memory layer 350. Additionally, retention layer 340 may form an ohmic contact with top electrode 330.

Data retention in the memory cell is greatly influenced by the diffusion of oxygen ions and oxygen vacancies between the top electrode layer 330 and the memory layer 350. Retention layer 340 may be placed between the top electrode layer 330 and the memory layer 350 and improves memory cell retention. Because retention layer 340 is resistant to conduction of oxygen ions and vacancies, oxygen ions and vacancies are less likely to diffuse between the oxide on the retention layer 340 side of top electrode layer 330 and the memory layer 350, and data retention is improved. In addition, because retention layer 340 is electrically conductive, electrical performance of the memory cell experiences little or substantially no degradation as a consequence of retention layer 340.

The retention layer 340 may be formed using any deposition process, such as PVD, CVD, sputtering, evaporation, ALD, or another deposition or growth process. Furthermore, in some embodiments, retention layer 340 experiences substantially no chemical reaction with the memory layer 350, such that the characteristics of the memory layer 350 and the retention layer 340 remain substantially unaffected by one another. Also, in some embodiments, substantially no diffusion occurs between the retention layer 340 and the memory layer 350, such that the characteristics of the memory layer 350 and the retention layer 340 remain substantially unaffected by one another.

In some embodiments, memory layer 350 includes at least one of Praseodymium Calcium Manganese Oxide or (Pr1−xCax)MnO$_3$ (PCMO), (Sm1−xCax)MnO$_3$, and (La1−xSrx)MnO$_3$. In alternative embodiments, one or more other materials are used. In some embodiments, the memory layer 350 is between about 5 nm and about 10 nm thick.

In some embodiments, template layer 360 includes at least one of LaNiO$_3$, NdNiO$_3$, SrRuO$_3$, CaRuO$_3$, and LaMnO$_3$. In alternative embodiments, one or more other materials are used.

The electrical conductivity of the template layer 360 is similar to conductivity of commonly used metallic bottom electrodes, such as Ru. For example, the electrical conductivity of the template layer 360 may be greater than about $10 \times 30^6$ S m$^{-1}$. In some embodiments, the electrical conductivity of the template layer 360 is greater than about $15 \times 30^6$ S m$^{-1}$, is greater than about $20 \times 30^6$ S m$^{-1}$, is greater than about $30 \times 30^6$ S m$^{-1}$, or is greater than about $50 \times 30^6$ S m$^{-1}$. In addition, the crystalline structure and lattice parameters of the template layer 360 are similar to those of the memory layer 350. For example, the crystalline structure and lattice parameters of the template layer match the crystalline structure and lattice parameters of the memory layer 350. Consequently, misfit stresses between the template layer 360 and the memory layer 350 are less than that which would occur in the memory layer 350 if the memory layer 350 were formed directly on the bottom barrier 370.

In some embodiments, the template layer 360 behaves as a latency layer at least partly because of its low resistivity. Accordingly, the resistance of the memory device 300 is lowered. This, combined with the effect of the retention layer 340 and the high on/off resistance ratio, increases the memory window, such that low read voltages may be used. For example, the read voltage can be about 0.5 V, about 0.4 V, 0.3 V, 0.2 V, 0.1 V or lower.

The template layer 360 may be formed using any deposition process, such as physical vapor deposition (PVD), chemical vapor deposition (CVD), sputtering, evaporation, atomic layer deposition (ALD), or another deposition or growth process.

In some embodiments, memory layer 350 may be epitaxially grown on template layer 360. In some embodiments, the memory layer 350 is formed into thin films (e.g. epitaxially grown crystalline thin films) on the template layer 360 at temperatures lower than 450 C. In some embodiments, the temperature while forming the template layer 360 may be 400 C or less, 350 C or less, 300 C or less, 250 C or less, or 200 C or less. Because of the low temperature while forming the template layer 360, the template layer 360 may be formed as part of a CMOS manufacturing process.

Furthermore, in some embodiments, template layer 360 experiences substantially no chemical reaction with the memory layer 350, such that the characteristics of the memory layer 350 remain substantially unaffected by the template layer 360. Also, in some embodiments, substantially no diffusion occurs between the template layer 360 and the memory layer 350, such that the characteristics of the memory layer 350 remain substantially unaffected by the template layer 360.

In some embodiments, the crystalline film of the memory layer 350 may be grown on an amorphous template layer 360 acting as a growth seed. In some embodiments, the crystalline film of the memory layer 350 may be grown on a crystalline template layer 360 acting as a seed. When the memory layer 350 is grown, the ambient environment (e.g., Ar and O$_2$) may have a pressure between 9 and 10 torr. In some embodiments, water is removed from the ambient environment.

In some embodiments, when the memory layer 350 is formed on the template layer 360, no or substantially no amorphous memory layer 350 or interface layer is formed at the interface between the memory layer 350 and the template layer 360. Accordingly, the thickness of the memory layer 350 is reduced, which is beneficial for high density devices.

The typical on/off resistance ratio (the ratio of the resistance of the on or low resistance state of the memory device 300 to the resistance of the off or high resistance state of the memory device 300) for interface switching material films is not amenable for multi-bit storage in a single cell. However, in embodiments such as that illustrated in FIG. 2, because of the substantially defect free interface between the memory layer 350 and the template layer 360 and because of the high quality crystalline structure of the memory layer 350, few, if any, oxygen ions are trapped by crystal defects, such that substantially all of the oxygen ions are free to migrate between the memory layer 350 and the top electrode 330, and the on/off resistance ratio of the memory device 300 is maximized. For example, the on/off resistance ratio may be 2 or greater, 5 or greater, 10 or greater, 20 or greater, 35 or greater, 50 or greater, 75 or greater, or 100 or greater.

In some embodiments, conductive bottom barrier layer 370 includes at least one of Titanium Nitride (TiN), Tantalum Nitride (TaN), Titanium Aluminum Nitride (TiAlN), Tantalum Aluminum Nitride (TaAlN), Titanium Silicon Nitride (TiSiN), Tantalum Silicon Nitride (TaSiN), and Titanium Tungsten (TiW). In alternative embodiments, one or more other materials are used. In some embodiments, conductive bottom barrier layer 370 is formed of substantially the same material as the top barrier layer 320.

The bottom barrier layer 370 may comprise an AOxBOx material having any of the properties of the AOxBOx materials discussed elsewhere herein. In some embodiments, bottom barrier layer 370 comprises first and second layers, where the first layer comprises an AOxBOx material having any of the properties of the AOxBOx materials discussed elsewhere herein, and the second layer comprises a noble metal. In some embodiments, bottom barrier layer 370 comprises first, second, and third layers, where the first layer comprises a noble metal, the second layer comprises an AOxBOx material having any of the properties of the AOxBOx materials discussed elsewhere herein, and the third layer comprises a noble metal, and where the second layer is between the first and third layers.

Bottom barrier layer 370 may be formed of a material having a band gap wider than that of one or more of the template layer 360, any retention layer 340, and the memory layer 350. Bottom barrier layer 370 is configured to substantially prevent the conduction of oxygen ions or vacancies during operation of the memory device 300. Accordingly, bottom barrier layer 370 substantially prevents oxygen ions or vacancies from escaping from the template layer 360 into the bottom barrier layer 370. In addition, bottom barrier layer 370 is configured to conduct electrical current between the template layer 360 and the bottom contact 380. For example, bottom barrier layer 370 may have a resistivity less than $1 \times 10^{-4}$ ohm-m.

The bottom barrier layer 370 may be formed using any deposition process, such as PVD, CVD, sputtering, evaporation, ALD, or another deposition or growth process. Furthermore, in some embodiments, bottom barrier layer 370 experiences substantially no chemical reaction with the bottom contact 380, such that the characteristics of the bottom barrier layer 370 and the bottom contact 380 remain substantially unaffected by one another. Also, in some embodiments, substantially no diffusion occurs between the bottom barrier layer 370 and the bottom contact 380, such that the characteristics of the bottom barrier layer 370 and the bottom contact 380 remain substantially unaffected by one another.

In some embodiments, bottom contact 380 includes at least one of Copper (Cu), Aluminum (Al), Tungsten (W), Ruthenium (Ru), Platinum (Pt), Iridium (Ir), and Rhodium (Rh). In alternative embodiments, one or more other materials are used. In some embodiments, bottom contact 380 is formed of substantially the same material as the top contact 310.

In some embodiments, side barrier 390 includes at least one of AlOx, $SiO_2$, and $Si_3N_4$. In alternative embodiments, one or more other materials are used.

Reliability of interface switching memories which conduct ions and vacancies between layers depends critically on losses of the critical species from the cell. Therefore, techniques to prevent any losses of the critical species from the cell during the cycling and retention are beneficial.

In memory device 300, top barrier layer 320, bottom barrier layer 370, and side barrier layers 390 have little or substantially zero oxygen ion diffusion coefficients, such that the oxygen ions and vacancies are confined to top electrode layer 330, retention layer 340 (if present), memory layer 350, and template layer 360 by top barrier layer 320, bottom barrier layer 370, and side barrier layers 390. As a result, the reliability of memory device 300 is excellent.

The side barrier layers 390 may be formed using any deposition process, such as PVD, CVD, sputtering, evaporation, ALD, or another deposition or growth process. Furthermore, in some embodiments, side barrier layers 390 experience substantially no chemical reaction with the other layers, such that the characteristics of the side barrier layers 390 and the other layers remain substantially unaffected by one another. Also, in some embodiments, substantially no diffusion occurs between the side barrier layers 390 and the other layers, such that the characteristics of the side barrier layers 390 and the other layers remain substantially unaffected by one another.

In certain embodiments, bottom contact 380 is formed with Cu, conductive bottom barrier layer 370 is formed with TaN, template layer 360 is formed with $LaNiO_3$, memory layer 350 is formed with PCMO, retention layer 340 is formed with SnO, top electrode layer 330 is formed with W, top barrier layer 320 is formed with TaN, and top contact 310 is formed with Cu.

In certain embodiments, bottom contact 380 is formed with Ru, conductive bottom barrier layer 370 is formed with TaN, template layer 360 is formed with $SrRuO_3$, memory layer 350 is formed with PCMO, retention layer 340 is formed with doped ZnO, top electrode layer 330 is formed with W, top barrier layer 320 is formed with TaN, and top contact 310 is formed with Ru.

In certain embodiments, bottom contact 380 is formed with W, conductive bottom barrier layer 370 is formed with TaN, template layer 360 is formed with $CaRuO_3$, memory layer 350 is formed with $(SmCa)MnO_3$, retention layer 340 is formed with InOx, top electrode layer 330 is formed with W, top barrier layer 320 is formed with TaN, and top contact 310 is formed with Cu.

Figure 4:
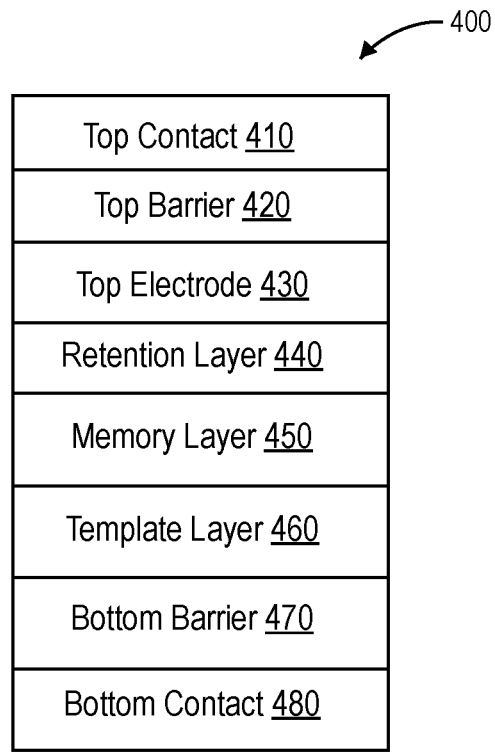
FIG. 4 is a schematic illustration of a memory device according to an embodiment.

FIG. 4 is a schematic illustration of a memory device 400 according to an embodiment. Memory device 400 includes bottom contact 480, conductive bottom barrier layer 470, template layer 460, memory layer 450, optional retention layer 440, top electrode layer 430, top barrier layer 420, and top contact 410.

Memory device 400 may be formed by forming bottom contact 480, forming conductive bottom barrier layer 470 on bottom contact 480, forming template layer 460 on conductive bottom barrier layer 470, forming memory layer 450 on template layer 460, optionally forming retention layer 440 on memory layer 450, forming top electrode layer 430 on retention layer 440 or on memory layer 450, forming top barrier layer 420 on top electrode layer 430, and forming top contact 410 on top barrier layer 420.

In some embodiments, each of the interfaces of the various layers of memory device 400 forms an ohmic contact between the layers.

Top contact 410 may have characteristics similar or identical to those of top contact 210 discussed elsewhere herein.

Top contact 410 is used to form an electrical connection between the memory device 400 and other electrical components. Top contact 400 may also be used to form a mechanical connection between the memory device 400 and another device.

Top barrier layer 420 may have characteristics similar or identical to those of top barrier layer 220 discussed elsewhere herein.

The top barrier layer 420 may comprise an AOxBOx material having any of the properties of the AOxBOx materials discussed elsewhere herein. In some embodiments, top barrier layer 420 comprises first and second layers, where the first layer comprises an AOxBOx material having any of the properties of the AOxBOx materials discussed elsewhere herein, and the second layer comprises a noble metal. In some embodiments, top barrier layer 420 comprises first, second, and third layers, where the first layer comprises a noble metal, the second layer comprises an AOxBOx material having any of the properties of the AOxBOx materials discussed elsewhere herein, and the third layer comprises a noble metal, and where the second layer is between the first and third layers.

Top barrier layer 420 may be formed of a material having a band gap wider than that of one or more of the top electrode layer 430, any retention layer 440, and the memory layer 450. Top barrier layer 420 is configured to substantially prevent the conduction of oxygen ions or vacancies during operation of the memory device 400. Accordingly, top barrier layer 420 substantially prevents oxygen ions or vacancies from escaping from the top electrode layer 430 into the top barrier layer 420. In addition, top barrier layer 420 is configured to conduct electrical current between the top electrode layer 430 and the top contact 410.

The top barrier layer 420 may be formed using any deposition process, such as PVD, CVD, sputtering, evaporation, ALD, or another deposition or growth process. Furthermore, in some embodiments, top barrier layer 420 experiences substantially no chemical reaction with the top electrode 430, such that the characteristics of the top barrier layer 420 and the top electrode 430 remain substantially unaffected by one another. Also, in some embodiments, substantially no diffusion occurs between the top barrier layer 420 and the top electrode 430, such that the characteristics of the memory layer 450 and the retention layer 440 remain substantially unaffected by one another.

Top electrode layer 430 may have characteristics similar or identical to those of top electrode layer 230 discussed elsewhere herein.

Top electrode layer 430 forms an electrical connection between the retention layer 440 or the memory layer 450 and the top barrier layer 420. Top electrode layer 430 is formed with a material which forms a secure bond with the retention layer 440 or the memory layer 450.

Top electrode layer 430 cooperatively forms a metal oxide heterojunction memory with memory layer 450, and is configured to accept or donate oxygen ions or vacancies from or to memory layer 450 in response to an electric field applied across the electrode layer 430 and the memory layer 450. In some embodiments, the top electrode layer 430 may be oxygen-rich and may cooperatively form an oxygen ion heterojunction memory cell with memory layer 450. In alternative embodiments, the top electrode layer 430 may be oxygen depleted and may cooperatively form an oxygen vacancy heterojunction memory cell with memory layer 450.

Optional retention layer 440 may have characteristics similar or identical to those of optional retention layer 240 discussed elsewhere herein.

In some embodiments, retention layer 440 may experience no chemical interaction with the top electrode layer 430 and memory layer 450. Additionally, retention layer 440 may form an ohmic contact with top electrode 430.

Data retention in the memory cell is greatly influenced by the diffusion of oxygen ions and oxygen vacancies between the top electrode layer 430 and the memory layer 450. Retention layer 440 may be placed between the top electrode layer 430 and the memory layer 450 and improves memory cell retention. Because retention layer 440 is resistant to conduction of oxygen ions and vacancies, oxygen ions and vacancies are less likely to diffuse between the oxide on the retention layer 440 side of top electrode layer 430 and the memory layer 450, and data retention is improved. In addition, because retention layer 440 is electrically conductive, electrical performance of the memory cell experiences little or substantially no degradation as a consequence of retention layer 440.

The retention layer 440 may be formed using any deposition process, such as PVD, CVD, sputtering, evaporation, ALD, or another deposition or growth process. Furthermore, in some embodiments, retention layer 440 experiences substantially no chemical reaction with the memory layer 450, such that the characteristics of the memory layer 450 and the retention layer 440 remain substantially unaffected by one another. Also, in some embodiments, substantially no diffusion occurs between the retention layer 440 and the memory layer 450, such that the characteristics of the memory layer 450 and the retention layer 440 remain substantially unaffected by one another.

Memory layer 450 may have characteristics similar or identical to those of memory layer 250 discussed elsewhere herein.

Template layer 460 may have characteristics similar or identical to those of template layer 260 discussed elsewhere herein.

The electrical conductivity of the template layer 460 is similar to conductivity of commonly used metallic bottom electrodes, such as Ru. In addition, the crystalline structure and lattice parameters of the template layer 460 are similar to those of the memory layer 450. Consequently, misfit stresses between the template layer 460 and the memory layer 450 are minimized.

In some embodiments, the template layer 460 behaves as a latency layer at least partly because of its low resistivity. Accordingly, the resistance of the memory device 400 is lowered. This, combined with the effect of the retention layer 440 and the high on/off resistance ratio, increases the memory window, such that low read voltages may be used. For example, the read voltage can be about 0.5 V, about 0.4 V, 0.3 V, 0.2 V, 0.1 V or lower.

The template layer 460 may be formed using any deposition process, such as physical vapor deposition (PVD), chemical vapor deposition (CVD), sputtering, evaporation, atomic layer deposition (ALD), or another deposition or growth process.

In some embodiments, memory layer 450 may be epitaxially grown on template layer 460. In some embodiments, the memory layer 450 is formed into thin films (e.g. epitaxially grown crystalline thin films) on the template layer 460 at temperatures lower than 450 C. In some embodiments, the temperature while forming the template layer 460 may be 400 C or less, 450 C or less, 400 C or less, 450 C or less, or 400 C or less. Because of the low temperature while forming the template layer 460, the template layer 460 may be formed as part of a CMOS manufacturing process.

Furthermore, in some embodiments, template layer 460 experiences substantially no chemical reaction with the memory layer 450, such that the characteristics of the memory layer 450 remain substantially unaffected by the template layer 460. Also, in some embodiments, substantially no diffusion occurs between the template layer 460 and the memory layer 450, such that the characteristics of the memory layer 450 remain substantially unaffected by the template layer 460.

In some embodiments, the crystalline film of the memory layer 450 may be grown on an amorphous template layer 460 acting as a growth seed. In some embodiments, the crystalline film of the memory layer 450 may be grown on a crystalline template layer 460 acting as a seed. When the memory layer 450 is grown, the ambient environment (e.g., Ar and $O_2$) may have a pressure between 9 and 10 torr. In some embodiments, water is removed from the ambient environment.

In some embodiments, when the memory layer 450 is formed on the template layer 460, no or substantially no amorphous memory layer 450 or interface layer is formed at the interface between the memory layer 450 and the template layer 460. Accordingly, the thickness of the memory layer 450 is reduced, which is beneficial for high density devices.

The typical on/off resistance ratio (the ratio of the resistance of the on or low resistance state of the memory device 400 to the resistance of the off or high resistance state of the memory device 400) for interface switching material films is not amenable for multi-bit storage in a single cell. However, in embodiments such as that illustrated in FIG. 4, because of the substantially defect free interface between the memory layer 450 and the template layer 460 and because of the high quality crystalline structure of the memory layer 450, few, if any, oxygen ions are trapped by crystal defects, such that substantially all of the oxygen ions are free to migrate between the memory layer 450 and the top electrode 430, and the on/off resistance ratio of the memory device 400 is maximized. For example, the on/off resistance ratio may be 2 or greater, 5 or greater, 10 or greater, 20 or greater, 35 or greater, 50 or greater, 75 or greater, or 100 or greater.

Conductive bottom barrier layer 470 may have characteristics similar or identical to those of conductive bottom barrier layer 270 discussed elsewhere herein. In some embodiments, conductive bottom barrier layer 470 is formed of substantially the same material as the top barrier layer 420.

The bottom barrier layer 470 may comprise an AOxBOx material having any of the properties of the AOxBOx materials discussed elsewhere herein. In some embodiments, bottom barrier layer 470 comprises first and second layers, where the first layer comprises an AOxBOx material having any of the properties of the AOxBOx materials discussed elsewhere herein, and the second layer comprises a noble metal. In some embodiments, bottom barrier layer 470 comprises first, second, and third layers, where the first layer comprises a noble metal, the second layer comprises an AOxBOx material having any of the properties of the AOxBOx materials discussed elsewhere herein, and the third layer comprises a noble metal, and where the second layer is between the first and third layers.

Bottom barrier layer 470 may be formed of a material having a band gap wider than that of one or more of the template layer 460, any retention layer 440, and the memory layer 450. Bottom barrier layer 470 is configured to substantially prevent the conduction of oxygen ions or vacancies during operation of the memory device 400. Accordingly, bottom barrier layer 470 substantially prevents oxygen ions or vacancies from escaping from the template layer 460 into the bottom barrier layer 470. In addition, bottom barrier layer 470 is configured to conduct electrical current between the template layer 460 and the bottom contact 480.

The bottom barrier layer 470 may be formed using any deposition process, such as PVD, CVD, sputtering, evaporation, ALD, or another deposition or growth process. Furthermore, in some embodiments, bottom barrier layer 470 experiences substantially no chemical reaction with the bottom contact 480, such that the characteristics of the bottom barrier layer 470 and the bottom contact 480 remain substantially unaffected by one another. Also, in some embodiments, substantially no diffusion occurs between the bottom barrier layer 470 and the bottom contact 480, such that the characteristics of the bottom barrier layer 470 and the bottom contact 480 remain substantially unaffected by one another.

Bottom contact 480 may have characteristics similar or identical to those of conductive bottom contact 280 discussed elsewhere herein. In some embodiments, bottom contact 480 is formed of substantially the same material as the top contact 410.

Reliability of interface switching memories which conduct ions and vacancies between layers depends critically on losses of the critical species from the cell. Therefore, techniques to prevent any losses of the critical species from the cell during the cycling and retention are beneficial.

In memory device 400, top barrier layer 420 and bottom barrier layer 470 have little or substantially zero oxygen ion diffusion coefficients, such that the oxygen ions and vacancies are confined to top electrode layer 430, retention layer 440 (if present), memory layer 450, and template layer 460 by top barrier layer 420 and bottom barrier layer 470. As a result, the reliability of memory device 400 is excellent.

In certain embodiments, bottom contact 480 is formed with Cu, conductive bottom barrier layer 470 is formed with TaN, template layer 460 is formed with $LaNiO_3$, memory layer 450 is formed with PCMO, retention layer 440 is formed with SnO, top electrode layer 430 is formed with W, top barrier layer 420 is formed with TaN, and top contact 410 is formed with Cu.

In certain embodiments, bottom contact 480 is formed with Ru, conductive bottom barrier layer 470 is formed with TaN, template layer 460 is formed with $SrRuO_3$, memory layer 450 is formed with PCMO, retention layer 440 is formed with doped ZnO, top electrode layer 430 is formed with W, top barrier layer 420 is formed with TaN, and top contact 410 is formed with Ru.

In certain embodiments, bottom contact 480 is formed with W, conductive bottom barrier layer 470 is formed with TaN, template layer 460 is formed with $CaRuO_3$, memory layer 450 is formed with $(SmCa)MnO_3$, retention layer 440 is formed with InOx, top electrode layer 430 is formed with W, top barrier layer 420 is formed with TaN, and top contact 410 is formed with Cu.

Figure 5:
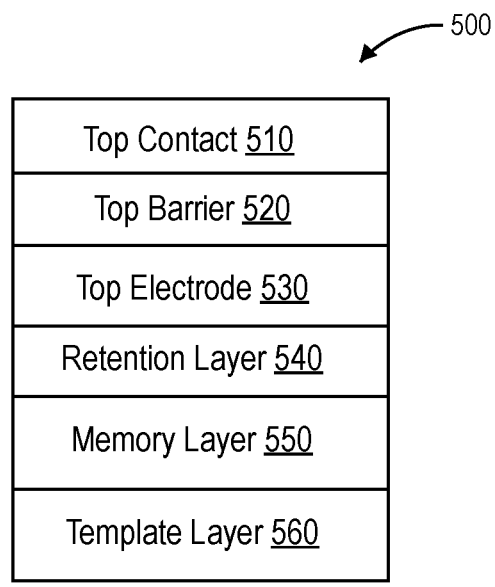
FIG. 5 is a schematic illustration of a memory device according to an embodiment.

FIG. 5 is a schematic illustration of a memory device 500 according to an embodiment. Memory device 500 includes template layer 560, memory layer 550, optional retention layer 540, top electrode layer 530, top barrier layer 520, and top contact 510.

Memory device 500 may be formed by forming template layer 560, forming memory layer 550 on template layer 560, optionally forming retention layer 540 on memory layer 550, forming top electrode layer 530 on retention layer 540 or on memory layer 550, forming top barrier layer 520 on top electrode layer 530, and forming top contact 510 on top barrier layer 520.

In some embodiments, each of the interfaces of the various layers of memory device 500 forms an ohmic contact between the layers.

Top contact 510 may have characteristics similar or identical to those of top contact 210 discussed elsewhere herein.

Top contact 510 is used to form an electrical connection between the memory device 500 and other electrical components. Top contact 510 may also be used to form a mechanical connection between the memory device 500 and another device.

Top barrier layer 520 may have characteristics similar or identical to those of top barrier layer 220 discussed elsewhere herein.

Top barrier layer 520 may be formed of a material having a band gap wider than that of one or more of the top electrode layer 530, any retention layer 540, and the memory layer 550. Top barrier layer 520 is configured to substantially prevent the conduction of oxygen ions or vacancies during operation of the memory device 500. Accordingly, top barrier layer 520 substantially prevents oxygen ions or vacancies from escaping from the top electrode layer 530 into the top barrier layer 520. In addition, top barrier layer 520 is configured to conduct electrical current between the top electrode layer 530 and the top contact 510.

The top barrier layer 520 may comprise an AOxBOx material having any of the properties of the AOxBOx materials discussed elsewhere herein. In some embodiments, top barrier layer 520 comprises first and second layers, where the first layer comprises an AOxBOx material having any of the properties of the AOxBOx materials discussed elsewhere herein, and the second layer comprises a noble metal. In some embodiments, top barrier layer 520 comprises first, second, and third layers, where the first layer comprises a noble metal, the second layer comprises an AOxBOx material having any of the properties of the AOxBOx materials discussed elsewhere herein, and the third layer comprises a noble metal, and where the second layer is between the first and third layers.

The top barrier layer 520 may be formed using any deposition process, such as PVD, CVD, sputtering, evaporation, ALD, or another deposition or growth process. Furthermore, in some embodiments, top barrier layer 520 experiences substantially no chemical reaction with the top electrode 530, such that the characteristics of the top barrier layer 520 and the top electrode 530 remain substantially unaffected by one another. Also, in some embodiments, substantially no diffusion occurs between the top barrier layer 520 and the top electrode 530, such that the characteristics of the memory layer 550 and the retention layer 540 remain substantially unaffected by one another.

Top electrode layer 530 may have characteristics similar or identical to those of top electrode layer 230 discussed elsewhere herein.

Top electrode layer 530 forms an electrical connection between the retention layer 540 or the memory layer 550 and the top barrier layer 520. Top electrode layer 530 is formed with a material which forms a secure bond with the retention layer 540 or the memory layer 550.

Top electrode layer 530 cooperatively forms a metal oxide heterojunction memory with memory layer 550, and is configured to accept or donate oxygen ions or vacancies from or to memory layer 550 in response to an electric field applied across the electrode layer 530 and the memory layer 550. In some embodiments, the top electrode layer 530 may be oxygen-rich and may cooperatively form an oxygen ion heterojunction memory cell with memory layer 550. In alternative embodiments, the top electrode layer 530 may be oxygen depleted and may cooperatively form an oxygen vacancy heterojunction memory cell with memory layer 550.

Optional retention layer 540 may have characteristics similar or identical to those of optional retention layer 240 discussed elsewhere herein.

In some embodiments, retention layer 540 may experience no chemical interaction with the top electrode layer 530 and memory layer 550. Additionally, retention layer 540 may form an ohmic contact with top electrode 530.

Data retention in the memory cell is greatly influenced by the diffusion of oxygen ions and oxygen vacancies between the top electrode layer 530 and the memory layer 550. Retention layer 540 may be placed between the top electrode layer 530 and the memory layer 550 and improves memory cell retention. Because retention layer 540 is resistant to conduction of oxygen ions and vacancies, oxygen ions and vacancies are less likely to diffuse between the oxide on the retention layer 540 side of top electrode layer 530 and the memory layer 550, and data retention is improved. In addition, because retention layer 540 is electrically conductive, electrical performance of the memory cell experiences little or substantially no degradation as a consequence of retention layer 540.

The retention layer 540 may be formed using any deposition process, such as PVD, CVD, sputtering, evaporation, ALD, or another deposition or growth process. Furthermore, in some embodiments, retention layer 540 experiences substantially no chemical reaction with the memory layer 550, such that the characteristics of the memory layer 550 and the retention layer 540 remain substantially unaffected by one another. Also, in some embodiments, substantially no diffusion occurs between the retention layer 540 and the memory layer 550, such that the characteristics of the memory layer 550 and the retention layer 540 remain substantially unaffected by one another.

Memory layer 550 may have characteristics similar or identical to those of memory layer 250 discussed elsewhere herein.

Template layer 560 may have characteristics similar or identical to those of template layer 260 discussed elsewhere herein.

The electrical conductivity of the template layer 560 is similar to conductivity of commonly used metallic bottom electrodes, such as Ru. In addition, the crystalline structure and lattice parameters of the template layer 560 are similar to those of the memory layer 550. Consequently, misfit stresses between the template layer 560 and the memory layer 550 are minimized.

In some embodiments, the template layer 560 behaves as a latency layer at least partly because of its low resistivity. Accordingly, the resistance of the memory device 500 is lowered. This, combined with the effect of the retention layer 540 and the high on/off resistance ratio, increases the memory window, such that low read voltages may be used.

For example, the read voltage can be about 0.5 V, about 0.4 V, 0.3 V, 0.2 V, 0.1 V or lower.

The template layer 560 may be formed using any deposition process, such as physical vapor deposition (PVD), chemical vapor deposition (CVD), sputtering, evaporation, atomic layer deposition (ALD), or another deposition or growth process.

In some embodiments, memory layer 550 may be epitaxially grown on template layer 560. In some embodiments, the memory layer 550 is formed into thin films (e.g. epitaxially grown crystalline thin films) on the template layer 560 at temperatures lower than 550 C. In some embodiments, the temperature while forming the template layer 560 may be 500 C or less, 550 C or less, 500 C or less, 550 C or less, or 500 C or less. Because of the low temperature while forming the template layer 560, the template layer 560 may be formed as part of a CMOS manufacturing process.

Furthermore, in some embodiments, template layer 560 experiences substantially no chemical reaction with the memory layer 550, such that the characteristics of the memory layer 550 remain substantially unaffected by the template layer 560. Also, in some embodiments, substantially no diffusion occurs between the template layer 560 and the memory layer 550, such that the characteristics of the memory layer 550 remain substantially unaffected by the template layer 560.

In some embodiments, the crystalline film of the memory layer 550 may be grown on an amorphous template layer 560 acting as a growth seed. In some embodiments, the crystalline film of the memory layer 550 may be grown on a crystalline template layer 560 acting as a seed. When the memory layer 550 is grown, the ambient environment (e.g., Ar and $O_2$) may have a pressure between 9 and 10 torr. In some embodiments, water is removed from the ambient environment.

In some embodiments, when the memory layer 550 is formed on the template layer 560, no or substantially no amorphous memory layer 550 or interface layer is formed at the interface between the memory layer 550 and the template layer 560. Accordingly, the thickness of the memory layer 550 is reduced, which is beneficial for high density devices.

The typical on/off resistance ratio (the ratio of the resistance of the on or low resistance state of the memory device 500 to the resistance of the off or high resistance state of the memory device 500) for interface switching material films is not amenable for multi-bit storage in a single cell. However, in embodiments such as that illustrated in FIG. 4, because of the substantially defect free interface between the memory layer 550 and the template layer 560 and because of the high quality crystalline structure of the memory layer 550, few, if any, oxygen ions are trapped by crystal defects, such that substantially all of the oxygen ions are free to migrate between the memory layer 550 and the top electrode 530, and the on/off resistance ratio of the memory device 500 is maximized. For example, the on/off resistance ratio may be 2 or greater, 5 or greater, 10 or greater, 20 or greater, 35 or greater, 50 or greater, 75 or greater, or 100 or greater.

Reliability of interface switching memories which conduct ions and vacancies between layers depends critically on losses of the critical species from the cell. Therefore, techniques to prevent any losses of the critical species from the cell during the cycling and retention are beneficial.

In memory device 500, top barrier layer 520 has little or a substantially zero oxygen ion diffusion coefficient, such that the oxygen ions and vacancies are confined to top electrode layer 530, retention layer 540 (if present), memory layer 550, and template layer 560 by top barrier layer 520. As a result, the reliability of memory device 500 is excellent.

Figure 6:
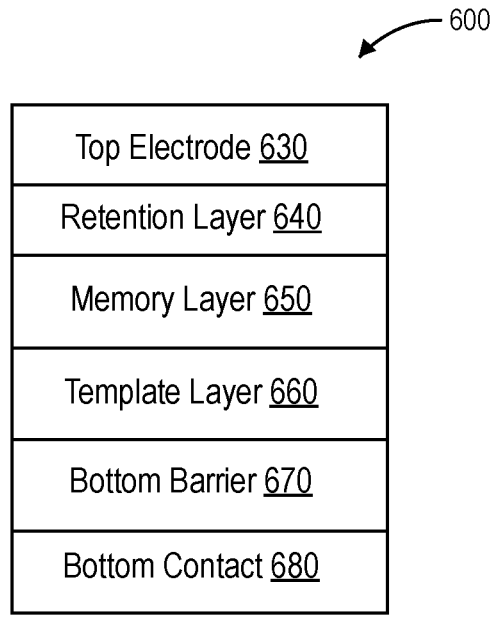
FIG. 6 is a schematic illustration of a memory device according to an embodiment.

FIG. 6 is a schematic illustration of a memory device 600 according to an embodiment. Memory device 600 includes bottom contact 680, conductive bottom barrier layer 670, template layer 660, memory layer 650, optional retention layer 640, top electrode layer 630, top barrier layer 620, and top contact 610.

Memory device 600 may be formed by forming bottom contact 680, forming conductive bottom barrier layer 670 on bottom contact 680, forming template layer 660 on conductive bottom barrier layer 670, forming memory layer 650 on template layer 660, optionally forming retention layer 640 on memory layer 650, forming top electrode layer 630 on retention layer 640 or on memory layer 650, forming top barrier layer 620 on top electrode layer 630, and forming top contact 610 on top barrier layer 620.

In some embodiments, each of the interfaces of the various layers of memory device 600 forms an ohmic contact between the layers.

Top electrode layer 630 may have characteristics similar or identical to those of top electrode layer 230 discussed elsewhere herein.

Top electrode layer 630 forms an electrical connection between the retention layer 640 and other electrical components. Top electrode layer 630 may also be used to form a mechanical connection between the memory device 600 and another device. Top electrode layer 630 is formed with a material which forms a secure bond with the retention layer 640.

Top electrode layer 630 cooperatively forms a metal oxide heterojunction memory with memory layer 650, and is configured to accept or donate oxygen ions or vacancies from or to memory layer 650 in response to an electric field applied across the electrode layer 630 and the memory layer 650. In some embodiments, the top electrode layer 630 may be oxygen-rich and may cooperatively form an oxygen ion heterojunction memory cell with memory layer 650. In alternative embodiments, the top electrode layer 630 may be oxygen depleted and may cooperatively form an oxygen vacancy heterojunction memory cell with memory layer 650.

Optional retention layer 640 may have characteristics similar or identical to those of optional retention layer 240 discussed elsewhere herein.

In some embodiments, retention layer 640 may experience no chemical interaction with the top electrode layer 630 and memory layer 650. Additionally, retention layer 640 may form an ohmic contact with top electrode 630.

Data retention in the memory cell is greatly influenced by the diffusion of oxygen ions and oxygen vacancies between the top electrode layer 630 and the memory layer 650. Retention layer 640 may be placed between the top electrode layer 630 and the memory layer 650 and improves memory cell retention. Because retention layer 640 is resistant to conduction of oxygen ions and vacancies, oxygen ions and vacancies are less likely to diffuse between the oxide on the retention layer 640 side of top electrode layer 630 and the memory layer 650, and data retention is improved. In addition, because retention layer 640 is electrically conductive, electrical performance of the memory cell experiences little or substantially no degradation as a consequence of retention layer 640.

The retention layer 640 may be formed using any deposition process, such as PVD, CVD, sputtering, evaporation, ALD, or another deposition or growth process. Furthermore, in some embodiments, retention layer 640 experiences substantially no chemical reaction with the memory layer 650, such that the characteristics of the memory layer 650 and the retention layer 640 remain substantially unaffected by one another. Also, in some embodiments, substantially no diffusion occurs between the retention layer 640 and the memory layer 650, such that the characteristics of the memory layer 650 and the retention layer 640 remain substantially unaffected by one another.

Memory layer 650 may have characteristics similar or identical to those of memory layer 250 discussed elsewhere herein.

Template layer 660 may have characteristics similar or identical to those of template layer 260 discussed elsewhere herein.

The electrical conductivity of the template layer 660 is similar to conductivity of commonly used metallic bottom electrodes, such as Ru. In addition, the crystalline structure and lattice parameters of the template layer 660 are similar to those of the memory layer 650. Consequently, misfit stresses between the template layer 660 and the memory layer 650 are minimized.

In some embodiments, the template layer 660 behaves as a latency layer at least partly because of its low resistivity. Accordingly, the resistance of the memory device 600 is lowered. This, combined with the effect of the retention layer 640 and the high on/off resistance ratio, increases the memory window, such that low read voltages may be used. For example, the read voltage can be about 0.5 V, about 0.4 V, 0.3 V, 0.2 V, 0.1 V or lower.

The template layer 660 may be formed using any deposition process, such as physical vapor deposition (PVD), chemical vapor deposition (CVD), sputtering, evaporation, atomic layer deposition (ALD), or another deposition or growth process.

In some embodiments, memory layer 650 may be epitaxially grown on template layer 660. In some embodiments, the memory layer 650 is formed into thin films (e.g. epitaxially grown crystalline thin films) on the template layer 660 at temperatures lower than 650 C. In some embodiments, the temperature while forming the template layer 660 may be 600 C or less, 650 C or less, 600 C or less, 650 C or less, or 600 C or less. Because of the low temperature while forming the template layer 660, the template layer 660 may be formed as part of a CMOS manufacturing process.

Furthermore, in some embodiments, template layer 660 experiences substantially no chemical reaction with the memory layer 650, such that the characteristics of the memory layer 650 remain substantially unaffected by the template layer 660. Also, in some embodiments, substantially no diffusion occurs between the template layer 660 and the memory layer 650, such that the characteristics of the memory layer 650 remain substantially unaffected by the template layer 660.

In some embodiments, the crystalline film of the memory layer 650 may be grown on an amorphous template layer 660 acting as a growth seed. In some embodiments, the crystalline film of the memory layer 650 may be grown on a crystalline template layer 660 acting as a seed. When the memory layer 650 is grown, the ambient environment (e.g., Ar and $O_2$) may have a pressure between 9 and 10 torr. In some embodiments, water is removed from the ambient environment.

In some embodiments, when the memory layer 650 is formed on the template layer 660, no or substantially no amorphous memory layer 650 or interface layer is formed at the interface between the memory layer 650 and the template layer 660. Accordingly, the thickness of the memory layer 650 is reduced, which is beneficial for high density devices.

The typical on/off resistance ratio (the ratio of the resistance of the on or low resistance state of the memory device 600 to the resistance of the off or high resistance state of the memory device 600) for interface switching material films is not amenable for multi-bit storage in a single cell. However, in embodiments such as that illustrated in FIG. 5, because of the substantially defect free interface between the memory layer 650 and the template layer 660 and because of the high quality crystalline structure of the memory layer 650, few, if any, oxygen ions are trapped by crystal defects, such that substantially all of the oxygen ions are free to migrate between the memory layer 650 and the top electrode 630, and the on/off resistance ratio of the memory device 600 is maximized. For example, the on/off resistance ratio may be 2 or greater, 5 or greater, 10 or greater, 20 or greater, 35 or greater, 50 or greater, 75 or greater, or 100 or greater.

In some embodiments, conductive bottom barrier layer 670 includes at least one of Titanium Nitride (TiN), Tantalum Nitride (TaN), Titanium Aluminum Nitride (TiAlN), Tantalum Aluminum Nitride (TaAlN), Titanium Silicon Nitride (TiSiN), Tantalum Silicon Nitride (TaSiN), and Titanium Tungsten (TiW). In alternative embodiments, one or more other materials are used. In some embodiments, conductive bottom barrier layer 670 is formed of substantially the same material as the top barrier layer 620.

The bottom barrier layer 670 may comprise an AOxBOx material having any of the properties of the AOxBOx materials discussed elsewhere herein. In some embodiments, bottom barrier layer 670 comprises first and second layers, where the first layer comprises an AOxBOx material having any of the properties of the AOxBOx materials discussed elsewhere herein, and the second layer comprises a noble metal. In some embodiments, bottom barrier layer 670 comprises first, second, and third layers, where the first layer comprises a noble metal, the second layer comprises an AOxBOx material having any of the properties of the AOxBOx materials discussed elsewhere herein, and the third layer comprises a noble metal, and where the second layer is between the first and third layers.

Bottom barrier layer 670 may be formed of a material having a band gap wider than that of one or more of the template layer 660, any retention layer 640, and the memory layer 650. Bottom barrier layer 670 is configured to substantially prevent the conduction of oxygen ions or vacancies during operation of the memory device 600. Accordingly, bottom barrier layer 670 substantially prevents oxygen ions or vacancies from escaping from the template layer 660 into the bottom barrier layer 670. In addition, bottom barrier layer 670 is configured to conduct electrical current between the template layer 660 and the bottom contact 680. For example, bottom barrier layer 670 may have a resistivity less than $1 \times 10^{-4}$ ohm-m.

The bottom barrier layer 670 may be formed using any deposition process, such as PVD, CVD, sputtering, evaporation, ALD, or another deposition or growth process. Furthermore, in some embodiments, bottom barrier layer 670 experiences substantially no chemical reaction with the bottom contact 680, such that the characteristics of the bottom barrier layer 670 and the bottom contact 680 remain substantially unaffected by one another. Also, in some embodiments, substantially no diffusion occurs between the bottom barrier layer 670 and the bottom contact 680, such that the characteristics of the bottom barrier layer 670 and the bottom contact 680 remain substantially unaffected by one another.

In some embodiments, bottom contact 680 includes at least one of Copper (Cu), Aluminum (Al), Tungsten (W), Ruthenium (Ru), Platinum (Pt), Iridium (Ir), and Rhodium (Rh). In alternative embodiments, one or more other materials are used. In some embodiments, bottom contact 680 is formed of substantially the same material as the top contact 610.

In certain embodiments, bottom contact 680 is formed with Cu, conductive bottom barrier layer 670 is formed with TaN, template layer 660 is formed with $LaNiO_3$, memory layer 650 is formed with PCMO, retention layer 640 is formed with SnO, top electrode layer 630 is formed with W, top barrier layer 620 is formed with TaN, and top contact 610 is formed with Cu.

In certain embodiments, bottom contact 680 is formed with Ru, conductive bottom barrier layer 670 is formed with TaN, template layer 660 is formed with $SrRuO_3$, memory layer 650 is formed with PCMO, retention layer 640 is formed with doped ZnO, top electrode layer 630 is formed with W, top barrier layer 620 is formed with TaN, and top contact 610 is formed with Ru.

In certain embodiments, bottom contact 680 is formed with W, conductive bottom barrier layer 670 is formed with TaN, template layer 660 is formed with $CaRuO_3$, memory layer 650 is formed with $(SmCa)MnO_3$, retention layer 640 is formed with InOx, top electrode layer 630 is formed with W, top barrier layer 620 is formed with TaN, and top contact 610 is formed with Cu.

Reliability of interface switching memories which conduct ions and vacancies between layers depends critically on losses of the critical species from the cell. Therefore, techniques to prevent any losses of the critical species from the cell during the cycling and retention are beneficial.

In memory device 600, bottom barrier layer 670 has little or a substantially zero oxygen ion diffusion coefficient, such that the oxygen ions and vacancies are confined to top electrode layer 630, retention layer 640 (if present), memory layer 650, and template layer 660 by bottom barrier layer 670. As a result, the reliability of memory device 600 is excellent.

Figure 7:
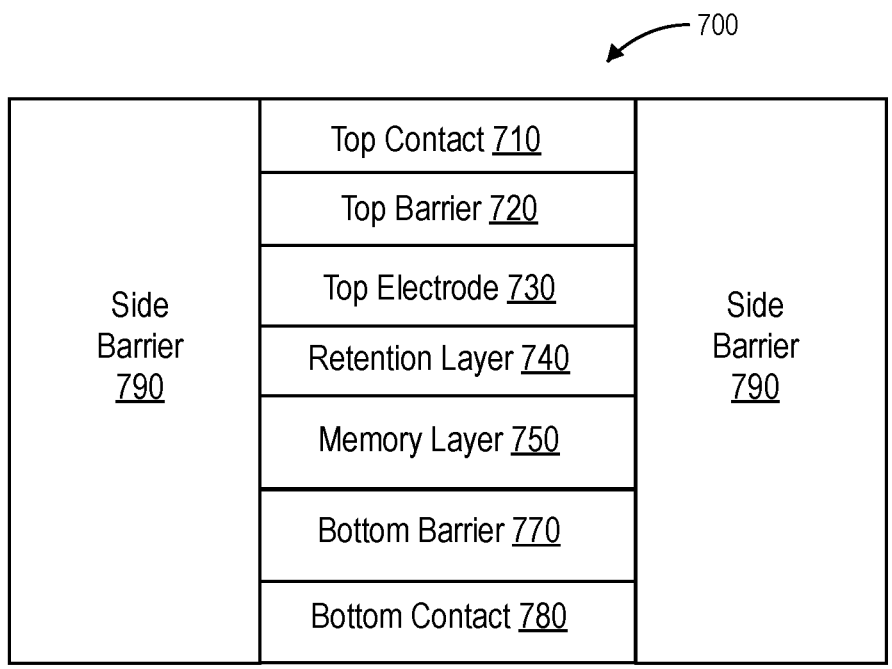
FIG. 7 is a schematic illustration of a memory device according to an embodiment.

FIG. 7 is a schematic illustration of a memory device 700 according to an embodiment. Memory device 700 includes bottom contact 780, conductive bottom barrier layer 770, memory layer 750, optional retention layer 740, top electrode layer 730, top barrier layer 720, top contact 710, and side barrier layer 790. In some embodiments, side barrier layer 790 is substantially annular and surrounds bottom contact 780, conductive bottom barrier layer 770, memory layer 750, retention layer 740 (if present), top electrode layer 730, top barrier layer 720, and top contact 710.

Memory device 700 may be formed by forming bottom contact 780, forming conductive bottom barrier layer 770 on bottom contact 780, forming memory layer 750 on conductive bottom barrier layer 770, optionally forming retention layer 740 on memory layer 750, forming top electrode layer 730 on retention layer 740 or on memory layer 750, forming top barrier layer 720 on top electrode layer 730, forming top contact 710 on top barrier layer 720, and forming side barrier layer 790 on both lateral sides of each of bottom contact 780, conductive bottom barrier layer 770, memory layer 750, retention layer 740 (if present), top electrode layer 730, top barrier layer 720, and top contact 710.

In some embodiments, each of the interfaces of the various layers of memory device 700 forms an ohmic contact between the layers.

In some embodiments, top contact 710 includes at least one of Copper (Cu), Aluminum (Al), Tungsten (W), Ruthenium (Ru), Platinum (Pt), Iridium (Ir), and Rhodium (Rh). In alternative embodiments, one or more other materials are used.

Top contact 710 is used to form an electrical connection between the memory device 700 and other electrical components. Top contact 700 may also be used to form a mechanical connection between the memory device 700 and another device.

In some embodiments, top barrier layer 720 includes at least one of Titanium Nitride (TiN), Tantalum Nitride (TaN), and Titanium Tungsten (TiW). In alternative embodiments, one or more other materials are used.

Top barrier layer 720 may be formed of a material having a band gap wider than that of one or more of the top electrode layer 730, any retention layer 740, and the memory layer 750. Top barrier layer 720 is configured to substantially prevent the conduction of oxygen ions or vacancies during operation of the memory device 700. Accordingly, top barrier layer 720 substantially prevents oxygen ions or vacancies from escaping from the top electrode layer 730 into the top barrier layer 720. In addition, top barrier layer 720 is configured to conduct electrical current between the top electrode layer 730 and the top contact 710.

The top barrier layer 720 may comprise an AOxBOx material having any of the properties of the AOxBOx materials discussed elsewhere herein. In some embodiments, top barrier layer 720 comprises first and second layers, where the first layer comprises an AOxBOx material having any of the properties of the AOxBOx materials discussed elsewhere herein, and the second layer comprises a noble metal. In some embodiments, top barrier layer 720 comprises first, second, and third layers, where the first layer comprises a noble metal, the second layer comprises an AOxBOx material having any of the properties of the AOxBOx materials discussed elsewhere herein, and the third layer comprises a noble metal, and where the second layer is between the first and third layers.

The top barrier layer 720 may be formed using any deposition process, such as PVD, CVD, sputtering, evaporation, ALD, or another deposition or growth process. Furthermore, in some embodiments, top barrier layer 720 experiences substantially no chemical reaction with the top electrode 730, such that the characteristics of the top barrier layer 720 and the top electrode 730 remain substantially unaffected by one another. Also, in some embodiments, substantially no diffusion occurs between the top barrier layer 720 and the top electrode 730, such that the characteristics of the memory layer 750 and the retention layer 740 remain substantially unaffected by one another.

In some embodiments, top electrode layer 730 includes at least one of Tungsten (W), Molybdenum (Mo), Nickel (Ni), Iron (Fe), Cobalt (Co), and Chromium (Cr). In alternative embodiments, one or more other materials are used. For example, another metal, conductive oxide, or other conductive compound may be use.

Top electrode layer 730 forms an electrical connection between the retention layer 740 or the memory layer 750 and the top barrier layer 720. Top electrode layer 730 is formed with a material which forms a secure bond with the retention layer 740 or the memory layer 750.

Top electrode layer 730 cooperatively forms a metal oxide heterojunction memory with memory layer 750, and is configured to accept or donate oxygen ions or vacancies from or to memory layer 750 in response to an electric field applied across the electrode layer 730 and the memory layer 750. In some embodiments, the top electrode layer 730 may be oxygen-rich and may cooperatively form an oxygen ion heterojunction memory cell with memory layer 750. In alternative embodiments, the top electrode layer 730 may be oxygen depleted and may cooperatively form an oxygen vacancy heterojunction memory cell with memory layer 750.

In some embodiments, optional retention layer 740 includes at least one of SnOx, InOx, (In, Sn)Ox, and doped ZnO. In alternative embodiments, one or more other materials are used.

In some embodiments, retention layer 740 has high electrical conductivity electrical conductivity. For example, retention layer 740 may have conductivity greater than $1 \times 10^{-4}$ ohm-m. Retention layer 740 may also be resistant to conduction of oxygen ions and vacancies in response to an applied electric field. In addition, voltage dependence of the ionic conductivity of retention layer 740 may be highly non-linear. Furthermore, retention layer 740 may experience no chemical interaction with the top electrode layer 730 and memory layer 750. Additionally, retention layer 740 may form an ohmic contact with top electrode 730.

Data retention in the memory cell is greatly influenced by the diffusion of oxygen ions and oxygen vacancies between the top electrode layer 730 and the memory layer 750. Retention layer 740 may be placed between the top electrode layer 730 and the memory layer 750 and improves memory cell retention. Because retention layer 740 is resistant to conduction of oxygen ions and vacancies, oxygen ions and vacancies are less likely to diffuse between the oxide on the retention layer 740 side of top electrode layer 730 and the memory layer 750, and data retention is improved. In addition, because retention layer 740 is electrically conductive, electrical performance of the memory cell experiences little or substantially no degradation as a consequence of retention layer 740.

The retention layer 740 may be formed using any deposition process, such as PVD, CVD, sputtering, evaporation, ALD, or another deposition or growth process. Furthermore, in some embodiments, retention layer 740 experiences substantially no chemical reaction with the memory layer 750, such that the characteristics of the memory layer 750 and the retention layer 740 remain substantially unaffected by one another. Also, in some embodiments, substantially no diffusion occurs between the retention layer 740 and the memory layer 750, such that the characteristics of the memory layer 750 and the retention layer 740 remain substantially unaffected by one another.

In some embodiments, memory layer 750 includes at least one of Praseodymium Calcium Manganese Oxide or (Pr1−xCax)MnO$_3$ (PCMO), (Sm1−xCax)MnO$_3$, and (La1−xSrx)MnO$_3$. In alternative embodiments, one or more other materials are used. In some embodiments, the memory layer 750 is between about 5 nm and about 10 nm thick.

In some embodiments, conductive bottom barrier layer 770 includes at least one of Titanium Nitride (TiN), Tantalum Nitride (TaN), and Titanium Tungsten (TiW). In alternative embodiments, one or more other materials are used. In some embodiments, conductive bottom barrier layer 770 is formed of substantially the same material as the top barrier layer 720.

Bottom barrier layer 770 may be formed of a material having a band gap wider than that of one or more of any retention layer 740, and the memory layer 750. Bottom barrier layer 770 is configured to substantially prevent the conduction of oxygen ions or vacancies during operation of the memory device 700. Accordingly, bottom barrier layer 770 substantially prevents oxygen ions or vacancies from escaping from the memory layer 750 into the bottom barrier layer 770. In addition, bottom barrier layer 770 is configured to conduct electrical current between the memory layer 750 and the bottom contact 780.

The bottom barrier layer 770 may comprise an AOxBOx material having any of the properties of the AOxBOx materials discussed elsewhere herein. In some embodiments, bottom barrier layer 770 comprises first and second layers, where the first layer comprises an AOxBOx material having any of the properties of the AOxBOx materials discussed elsewhere herein, and the second layer comprises a noble metal. In some embodiments, bottom barrier layer 770 comprises first, second, and third layers, where the first layer comprises a noble metal, the second layer comprises an AOxBOx material having any of the properties of the AOxBOx materials discussed elsewhere herein, and the third layer comprises a noble metal, and where the second layer is between the first and third layers.

The bottom barrier layer 770 may be formed using any deposition process, such as PVD, CVD, sputtering, evaporation, ALD, or another deposition or growth process. Furthermore, in some embodiments, bottom barrier layer 770 experiences substantially no chemical reaction with the bottom contact 780, such that the characteristics of the bottom barrier layer 770 and the bottom contact 780 remain substantially unaffected by one another. Also, in some embodiments, substantially no diffusion occurs between the bottom barrier layer 770 and the bottom contact 780, such that the characteristics of the bottom barrier layer 770 and the bottom contact 780 remain substantially unaffected by one another.

In some embodiments, bottom contact 780 includes at least one of Copper (Cu), Aluminum (Al), Tungsten (W), Ruthenium (Ru), Platinum (Pt), Iridium (Ir), and Rhodium (Rh). In alternative embodiments, one or more other materials are used. In some embodiments, bottom contact 780 is formed of substantially the same material as the top contact 710.

In some embodiments, side barrier 790 includes at least one of AlOx, $SiO_2$, and $Si_3N_4$. In alternative embodiments, one or more other materials are used.

Reliability of interface switching memories which conduct ions and vacancies between layers depends critically on losses of the critical species from the cell. Therefore, techniques to prevent any losses of the critical species from the cell during the cycling and retention are beneficial.

In memory device 700, top barrier layer 720, bottom barrier layer 770, and side barrier layers 790 have little or substantially zero oxygen ion diffusion coefficients, such that the oxygen ions and vacancies are confined to top electrode layer 730, retention layer 740 (if present), and memory layer 750, by top barrier layer 720, bottom barrier layer 770, and side barrier layers 790. As a result, the reliability of memory device 700 is excellent.

The side barrier layers 790 may be formed using any deposition process, such as PVD, CVD, sputtering, evaporation, ALD, or another deposition or growth process. Furthermore, in some embodiments, side barrier layers 790 experience substantially no chemical reaction with the other layers, such that the characteristics of the side barrier layers 790 and the other layers remain substantially unaffected by one another. Also, in some embodiments, substantially no diffusion occurs between the side barrier layers 790 and the other layers, such that the characteristics of the side barrier layers 790 and the other layers remain substantially unaffected by one another.

In certain embodiments, bottom contact 780 is formed with Cu, conductive bottom barrier layer 770 is formed with TaN, memory layer 750 is formed with PCMO, retention layer 740 is formed with SnO, top electrode layer 730 is formed with W, top barrier layer 720 is formed with TaN, and top contact 710 is formed with Cu.

In certain embodiments, bottom contact 780 is formed with Ru, conductive bottom barrier layer 770 is formed with TaN, memory layer 750 is formed with PCMO, retention layer 740 is formed with doped ZnO, top electrode layer 730 is formed with W, top barrier layer 720 is formed with TaN, and top contact 710 is formed with Ru.

In certain embodiments, bottom contact 780 is formed with W, conductive bottom barrier layer 770 is formed with TaN, memory layer 750 is formed with (SmCa)MnO$_3$, retention layer 740 is formed with InOx, top electrode layer 730 is formed with W, top barrier layer 720 is formed with TaN, and top contact 710 is formed with Cu.

FIG. 8 is a schematic illustration of a memory device 800 according to an embodiment. Memory device 800 includes bottom contact 880, conductive bottom barrier layer 870, memory layer 850, optional retention layer 840, top electrode layer 830, top barrier layer 820, and top contact 810.

Memory device 800 may be formed by forming bottom contact 880, forming conductive bottom barrier layer 870 on bottom contact 880, forming memory layer 850 on conductive bottom barrier layer 870, optionally forming retention layer 840 on memory layer 850, forming top electrode layer 830 on retention layer 840 or on memory layer 850, forming top barrier layer 820 on top electrode layer 830, and forming top contact 810 on top barrier layer 820.

In some embodiments, each of the interfaces of the various layers of memory device 800 forms an ohmic contact between the layers.

Top contact 810 may have characteristics similar or identical to those of top contact 210 discussed elsewhere herein.

Top contact 810 is used to form an electrical connection between the memory device 800 and other electrical components. Top contact 800 may also be used to form a mechanical connection between the memory device 800 and another device.

Top barrier layer 820 may have characteristics similar or identical to those of top barrier layer 220 discussed elsewhere herein.

Top barrier layer 820 may be formed of a material having a band gap wider than that of one or more of the top electrode layer 830, any retention layer 840, and the memory layer 850. Top barrier layer 820 is configured to substantially prevent the conduction of oxygen ions or vacancies during operation of the memory device 800. Accordingly, top barrier layer 820 substantially prevents oxygen ions or vacancies from escaping from the top electrode layer 830 into the top barrier layer 820. In addition, top barrier layer 820 is configured to conduct electrical current between the top electrode layer 830 and the top contact 810.

The top barrier layer 820 may comprise an AOxBOx material having any of the properties of the AOxBOx materials discussed elsewhere herein. In some embodiments, top barrier layer 820 comprises first and second layers, where the first layer comprises an AOxBOx material having any of the properties of the AOxBOx materials discussed elsewhere herein, and the second layer comprises a noble metal. In some embodiments, top barrier layer 820 comprises first, second, and third layers, where the first layer comprises a noble metal, the second layer comprises an AOxBOx material having any of the properties of the AOxBOx materials discussed elsewhere herein, and the third layer comprises a noble metal, and where the second layer is between the first and third layers.

The top barrier layer 820 may be formed using any deposition process, such as PVD, CVD, sputtering, evaporation, ALD, or another deposition or growth process. Furthermore, in some embodiments, top barrier layer 820 experiences substantially no chemical reaction with the top electrode 830, such that the characteristics of the top barrier layer 820 and the top electrode 830 remain substantially unaffected by one another. Also, in some embodiments, substantially no diffusion occurs between the top barrier layer 820 and the top electrode 830, such that the characteristics of the memory layer 850 and the retention layer 840 remain substantially unaffected by one another.

Top electrode layer 830 may have characteristics similar or identical to those of top electrode layer 630 discussed elsewhere herein.

Top electrode layer 830 forms an electrical connection between the retention layer 840 or the memory layer 850 and the top barrier layer 820. Top electrode layer 830 is formed with a material which forms a secure bond with the retention layer 840 or the memory layer 850.

Top electrode layer 830 cooperatively forms a metal oxide heterojunction memory with memory layer 850, and is configured to accept or donate oxygen ions or vacancies from or to memory layer 850 in response to an electric field applied across the electrode layer 830 and the memory layer 850. In some embodiments, the top electrode layer 830 may be oxygen-rich and may cooperatively form an oxygen ion heterojunction memory cell with memory layer 850. In alternative embodiments, the top electrode layer 830 may be oxygen depleted and may cooperatively form an oxygen vacancy heterojunction memory cell with memory layer 850.

Optional retention layer 840 may have characteristics similar or identical to those of optional retention layer 240 discussed elsewhere herein.

In some embodiments, retention layer 840 may experience no chemical interaction with the top electrode layer 830 and memory layer 850. Additionally, retention layer 840 may form an ohmic contact with top electrode 830.

Data retention in the memory cell is greatly influenced by the diffusion of oxygen ions and oxygen vacancies between the top electrode layer 830 and the memory layer 850. Retention layer 840 may be placed between the top electrode layer 830 and the memory layer 850 and improves memory cell retention. Because retention layer 840 is resistant to conduction of oxygen ions and vacancies, oxygen ions and vacancies are less likely to diffuse between the oxide on the retention layer 840 side of top electrode layer 830 and the memory layer 850, and data retention is improved. In addition, because retention layer 840 is electrically conductive, electrical performance of the memory cell experiences little or substantially no degradation as a consequence of retention layer 840.

The retention layer 840 may be formed using any deposition process, such as PVD, CVD, sputtering, evaporation, ALD, or another deposition or growth process. Furthermore, in some embodiments, retention layer 840 experiences substantially no chemical reaction with the memory layer 850, such that the characteristics of the memory layer 850 and the retention layer 840 remain substantially unaffected by one another. Also, in some embodiments, substantially no diffusion occurs between the retention layer 840 and the memory layer 850, such that the characteristics of the memory layer 850 and the retention layer 840 remain substantially unaffected by one another.

Memory layer 850 may have characteristics similar or identical to those of memory layer 250 discussed elsewhere herein.

Conductive bottom barrier layer 870 may have characteristics similar or identical to those of conductive bottom barrier layer 270 discussed elsewhere herein. In some embodiments, conductive bottom barrier layer 870 is formed of substantially the same material as the top barrier layer 820.

Bottom barrier layer 870 may be formed of a material having a band gap wider than that of one or more of any retention layer 840 and the memory layer 850. Bottom barrier layer 870 is configured to substantially prevent the conduction of oxygen ions or vacancies during operation of the memory device 800. Accordingly, bottom barrier layer 870 substantially prevents oxygen ions or vacancies from escaping from the memory layer 850 into the bottom barrier layer 870. In addition, bottom barrier layer 870 is configured to conduct electrical current between the memory layer 850 and the bottom contact 880.

The bottom barrier layer 870 may comprise an AOxBOx material having any of the properties of the AOxBOx materials discussed elsewhere herein. In some embodiments, bottom barrier layer 870 comprises first and second layers, where the first layer comprises an AOxBOx material having any of the properties of the AOxBOx materials discussed elsewhere herein, and the second layer comprises a noble metal. In some embodiments, bottom barrier layer 870 comprises first, second, and third layers, where the first layer comprises a noble metal, the second layer comprises an AOxBOx material having any of the properties of the AOxBOx materials discussed elsewhere herein, and the third layer comprises a noble metal, and where the second layer is between the first and third layers.

The bottom barrier layer 870 may be formed using any deposition process, such as PVD, CVD, sputtering, evaporation, ALD, or another deposition or growth process. Furthermore, in some embodiments, bottom barrier layer 870 experiences substantially no chemical reaction with the bottom contact 880, such that the characteristics of the bottom barrier layer 870 and the bottom contact 880 remain substantially unaffected by one another. Also, in some embodiments, substantially no diffusion occurs between the bottom barrier layer 870 and the bottom contact 880, such that the characteristics of the bottom barrier layer 870 and the bottom contact 880 remain substantially unaffected by one another.

Bottom contact 880 may have characteristics similar or identical to those of conductive bottom contact 280 discussed elsewhere herein. In some embodiments, bottom contact 880 is formed of substantially the same material as the top contact 810.

Reliability of interface switching memories which conduct ions and vacancies between layers depends critically on losses of the critical species from the cell. Therefore, techniques to prevent any losses of the critical species from the cell during the cycling and retention are beneficial.

In memory device 800, top barrier layer 820 and bottom barrier layer 870 have little or substantially zero oxygen ion diffusion coefficients, such that the oxygen ions and vacancies are confined to top electrode layer 830, retention layer 840 (if present), and memory layer 850 by top barrier layer 820 and bottom barrier layer 870. As a result, the reliability of memory device 800 is excellent.

In certain embodiments, bottom contact 880 is formed with Cu, conductive bottom barrier layer 870 is formed with TaN, memory layer 850 is formed with PCMO, retention layer 840 is formed with SnO, top electrode layer 830 is formed with W, top barrier layer 820 is formed with TaN, and top contact 810 is formed with Cu.

In certain embodiments, bottom contact 880 is formed with Ru, conductive bottom barrier layer 870 is formed with TaN, memory layer 850 is formed with PCMO, retention layer 840 is formed with doped ZnO, top electrode layer 830 is formed with W, top barrier layer 820 is formed with TaN, and top contact 810 is formed with Ru.

In certain embodiments, bottom contact 880 is formed with W, conductive bottom barrier layer 870 is formed with TaN, memory layer 850 is formed with $(SmCa)MnO_3$, retention layer 840 is formed with InOx, top electrode layer 830 is formed with W, top barrier layer 820 is formed with TaN, and top contact 810 is formed with Cu.

FIG. 9 is a schematic illustration of a memory device 900 according to an embodiment. Memory device 900 includes memory layer 950, optional retention layer 940, top electrode layer 930, top barrier layer 920, and top contact 910.

Memory device 900 may be formed by forming memory layer 950, optionally forming retention layer 940 on memory layer 950, forming top electrode layer 930 on retention layer 940 or on memory layer 950, forming top barrier layer 920 on top electrode layer 930, and forming top contact 910 on top barrier layer 920.

In some embodiments, each of the interfaces of the various layers of memory device 900 forms an ohmic contact between the layers.

Top contact 910 may have characteristics similar or identical to those of top contact 210 discussed elsewhere herein.

Top contact 910 is used to form an electrical connection between the memory device 900 and other electrical components. Top contact 910 may also be used to form a mechanical connection between the memory device 900 and another device.

Top barrier layer 920 may have characteristics similar or identical to those of top barrier layer 220 discussed elsewhere herein.

Top barrier layer 920 may be formed of a material having a band gap wider than that of one or more of the top electrode layer 930, any retention layer 940, and the memory layer 950. Top barrier layer 920 is configured to substantially prevent the conduction of oxygen ions or vacancies during operation of the memory device 900. Accordingly, top barrier layer 920 substantially prevents oxygen ions or vacancies from escaping from the top electrode layer 930 into the top barrier layer 920. In addition, top barrier layer 920 is configured to conduct electrical current between the top electrode layer 930 and the top contact 910.

The top barrier layer 920 may comprise an AOxBOx material having any of the properties of the AOxBOx materials discussed elsewhere herein. In some embodiments, top barrier layer 920 comprises first and second layers, where the first layer comprises an AOxBOx material having any of the properties of the AOxBOx materials discussed elsewhere herein, and the second layer comprises a noble metal. In some embodiments, top barrier layer 920 comprises first, second, and third layers, where the first layer comprises a noble metal, the second layer comprises an AOxBOx material having any of the properties of the AOxBOx materials discussed elsewhere herein, and the third layer comprises a noble metal, and where the second layer is between the first and third layers.

The top barrier layer 920 may be formed using any deposition process, such as PVD, CVD, sputtering, evaporation, ALD, or another deposition or growth process. Furthermore, in some embodiments, top barrier layer 920 experiences substantially no chemical reaction with the top electrode 930, such that the characteristics of the top barrier layer 920 and the top electrode 930 remain substantially unaffected by one another. Also, in some embodiments, substantially no diffusion occurs between the top barrier layer 920 and the top electrode 930, such that the characteristics of the memory layer 950 and the retention layer 940 remain substantially unaffected by one another.

Top electrode layer 930 may have characteristics similar or identical to those of top electrode layer 230 discussed elsewhere herein.

Top electrode layer 930 forms an electrical connection between the retention layer 940 or the memory layer 950 and the top barrier layer 920. Top electrode layer 930 is formed with a material which forms a secure bond with the retention layer 940 or the memory layer 950.

Top electrode layer 930 cooperatively forms a metal oxide heterojunction memory with memory layer 950, and is configured to accept or donate oxygen ions or vacancies from or to memory layer 950 in response to an electric field applied across the electrode layer 930 and the memory layer 950. In some embodiments, the top electrode layer 930 may be oxygen-rich and may cooperatively form an oxygen ion heterojunction memory cell with memory layer 950. In alternative embodiments, the top electrode layer 930 may be oxygen depleted and may cooperatively form an oxygen vacancy heterojunction memory cell with memory layer 950.

Optional retention layer 940 may have characteristics similar or identical to those of optional retention layer 240 discussed elsewhere herein.

In some embodiments, retention layer 940 may experience no chemical interaction with the top electrode layer 930 and memory layer 950. Additionally, retention layer 940 may form an ohmic contact with top electrode 930.

Data retention in the memory cell is greatly influenced by the diffusion of oxygen ions and oxygen vacancies between the top electrode layer 930 and the memory layer 950. Retention layer 940 may be placed between the top electrode layer 930 and the memory layer 950 and improves memory cell retention. Because retention layer 940 is resistant to conduction of oxygen ions and vacancies, oxygen ions and vacancies are less likely to diffuse between the oxide on the retention layer 940 side of top electrode layer 930 and the memory layer 950, and data retention is improved. In addition, because retention layer 940 is electrically conductive, electrical performance of the memory cell experiences little or substantially no degradation as a consequence of retention layer 940.

The retention layer 940 may be formed using any deposition process, such as PVD, CVD, sputtering, evaporation, ALD, or another deposition or growth process. Furthermore, in some embodiments, retention layer 940 experiences substantially no chemical reaction with the memory layer 950, such that the characteristics of the memory layer 950 and the retention layer 940 remain substantially unaffected by one another. Also, in some embodiments, substantially no diffusion occurs between the retention layer 940 and the memory layer 950, such that the characteristics of the memory layer 950 and the retention layer 940 remain substantially unaffected by one another.

Memory layer 950 may have characteristics similar or identical to those of memory layer 250 discussed elsewhere herein.

Reliability of interface switching memories which conduct ions and vacancies between layers depends critically on losses of the critical species from the cell. Therefore, techniques to prevent any losses of the critical species from the cell during the cycling and retention are beneficial.

In memory device 900, top barrier layer 920 has little or a substantially zero oxygen ion diffusion coefficient, such that the oxygen ions and vacancies are confined to top electrode layer 930, retention layer 940 (if present), and memory layer 950 by top barrier layer 920. As a result, the reliability of memory device 900 is excellent.

FIG. 10 is a schematic illustration of a memory device 1000 according to an embodiment. Memory device 1000 includes bottom contact 1080, conductive bottom barrier layer 1070, memory layer 1050, optional retention layer 1040, top electrode layer 1030, top barrier layer 1020, and top contact 1010.

Memory device 1000 may be formed by forming bottom contact 1080, forming conductive bottom barrier layer 1070 on bottom contact 1080, forming memory layer 1050 on conductive bottom barrier layer 1070, optionally forming retention layer 1040 on memory layer 1050, forming top electrode layer 1030 on retention layer 1040 or on memory layer 1050, forming top barrier layer 1020 on top electrode layer 1030, and forming top contact 1010 on top barrier layer 1020.

In some embodiments, each of the interfaces of the various layers of memory device 1000 forms an ohmic contact between the layers.

Top electrode layer 1030 may have characteristics similar or identical to those of top electrode layer 230 discussed elsewhere herein.

Top electrode layer 1030 forms an electrical connection between the retention layer 1040 and other electrical components. Top electrode layer 1030 may also be used to form a mechanical connection between the memory device 1000 and another device. Top electrode layer 1030 is formed with a material which forms a secure bond with the retention layer 1040.

Top electrode layer 1030 cooperatively forms a metal oxide heterojunction memory with memory layer 1050, and is configured to accept or donate oxygen ions or vacancies from or to memory layer 1050 in response to an electric field applied across the electrode layer 1030 and the memory layer 1050. In some embodiments, the top electrode layer 1030 may be oxygen-rich and may cooperatively form an oxygen ion heterojunction memory cell with memory layer 1050. In alternative embodiments, the top electrode layer 1030 may be oxygen depleted and may cooperatively form an oxygen vacancy heterojunction memory cell with memory layer 1050.

Optional retention layer 1040 may have characteristics similar or identical to those of optional retention layer 240 discussed elsewhere herein.

In some embodiments, retention layer 1040 may experience no chemical interaction with the top electrode layer 1030 and memory layer 1050. Additionally, retention layer 1040 may form an ohmic contact with top electrode 1030.

Data retention in the memory cell is greatly influenced by the diffusion of oxygen ions and oxygen vacancies between the top electrode layer 1030 and the memory layer 1050. Retention layer 1040 may be placed between the top electrode layer 1030 and the memory layer 1050 and improves memory cell retention. Because retention layer 1040 is resistant to conduction of oxygen ions and vacancies, oxygen ions and vacancies are less likely to diffuse between the oxide on the retention layer 1040 side of top electrode layer 1030 and the memory layer 1050, and data retention is improved. In addition, because retention layer 1040 is electrically conductive, electrical performance of the memory cell experiences little or substantially no degradation as a consequence of retention layer 1040.

The retention layer 1040 may be formed using any deposition process, such as PVD, CVD, sputtering, evaporation, ALD, or another deposition or growth process. Furthermore, in some embodiments, retention layer 1040 experiences substantially no chemical reaction with the memory layer 1050, such that the characteristics of the memory layer 1050 and the retention layer 1040 remain substantially unaffected by one another. Also, in some embodiments, substantially no diffusion occurs between the retention layer 1040 and the memory layer 1050, such that the characteristics of the memory layer 1050 and the retention layer 1040 remain substantially unaffected by one another.

Memory layer 1050 may have characteristics similar or identical to those of memory layer 250 discussed elsewhere herein.

In some embodiments, conductive bottom barrier layer 1070 includes at least one of Titanium Nitride (TiN), Tantalum Nitride (TaN), Titanium Aluminum Nitride (TiAlN), Tantalum Aluminum Nitride (TaAlN), Titanium Silicon Nitride (TiSiN), Tantalum Silicon Nitride (TaSiN), and Titanium Tungsten (TiW). In alternative embodiments, one or more other materials are used. In some embodiments, conductive bottom barrier layer 1070 is formed of substantially the same material as the top barrier layer 1020.

The bottom barrier layer 1070 may comprise an AOxBOx material having any of the properties of the AOxBOx materials discussed elsewhere herein. In some embodiments, bottom barrier layer 1070 comprises first and second layers, where the first layer comprises an AOxBOx material having any of the properties of the AOxBOx materials discussed elsewhere herein, and the second layer comprises a noble metal. In some embodiments, bottom barrier layer 1070 comprises first, second, and third layers, where the first layer comprises a noble metal, the second layer comprises an AOxBOx material having any of the properties of the AOxBOx materials discussed elsewhere herein, and the third layer comprises a noble metal, and where the second layer is between the first and third layers.

Bottom barrier layer 1070 may be formed of a material having a band gap wider than that of one or more of the template layer 1060, any retention layer 1040, and the memory layer 1050. Bottom barrier layer 1070 is configured to substantially prevent the conduction of oxygen ions or vacancies during operation of the memory device 1000. Accordingly, bottom barrier layer 1070 substantially prevents oxygen ions or vacancies from escaping from the template layer 1060 into the bottom barrier layer 1070. In addition, bottom barrier layer 1070 is configured to conduct electrical current between the template layer 1060 and the bottom contact 1080. For example, bottom barrier layer 1070 may have a resistivity less than $1 \times 10^{-4}$ ohm-m.

The bottom barrier layer 1070 may be formed using any deposition process, such as PVD, CVD, sputtering, evaporation, ALD, or another deposition or growth process. Furthermore, in some embodiments, bottom barrier layer 1070 experiences substantially no chemical reaction with the bottom contact 1080, such that the characteristics of the bottom barrier layer 1070 and the bottom contact 1080 remain substantially unaffected by one another. Also, in some embodiments, substantially no diffusion occurs between the bottom barrier layer 1070 and the bottom contact 1080, such that the characteristics of the bottom barrier layer 1070 and the bottom contact 1080 remain substantially unaffected by one another.

In some embodiments, bottom contact 1080 includes at least one of Copper (Cu), Aluminum (Al), Tungsten (W), Ruthenium (Ru), Platinum (Pt), Iridium (Ir), and Rhodium (Rh). In alternative embodiments, one or more other materials are used. In some embodiments, bottom contact 1080 is formed of substantially the same material as the top contact 1010.

In certain embodiments, bottom contact 1080 is formed with Cu, conductive bottom barrier layer 1070 is formed with TaN, template layer 1060 is formed with $LaNiO_3$, memory layer 1050 is formed with PCMO, retention layer 1040 is formed with SnO, top electrode layer 1030 is formed with W, top barrier layer 1020 is formed with TaN, and top contact 1010 is formed with Cu.

In certain embodiments, bottom contact 1080 is formed with Ru, conductive bottom barrier layer 1070 is formed with TaN, template layer 1060 is formed with $SrRuO_3$, memory layer 1050 is formed with PCMO, retention layer 1040 is formed with doped ZnO, top electrode layer 1030 is formed with W, top barrier layer 1020 is formed with TaN, and top contact 1010 is formed with Ru.

In certain embodiments, bottom contact 1080 is formed with W, conductive bottom barrier layer 1070 is formed with TaN, template layer 1060 is formed with $CaRuO_3$, memory layer 1050 is formed with $(SmCa)MnO_3$, retention layer 1040 is formed with InOx, top electrode layer 1030 is formed with W, top barrier layer 1020 is formed with TaN, and top contact 1010 is formed with Cu.

Reliability of interface switching memories which conduct ions and vacancies between layers depends critically on losses of the critical species from the cell. Therefore, techniques to prevent any losses of the critical species from the cell during the cycling and retention are beneficial.

In memory device 1000, bottom barrier layer 1070 has little or a substantially zero oxygen ion diffusion coefficient, such that the oxygen ions and vacancies are confined to top electrode layer 1030, retention layer 1040 (if present), memory layer 1050, and template layer 1060 by bottom barrier layer 1070. As a result, the reliability of memory device 1000 is excellent.

The cost of memories using an array of memory devices as described herein is much less than that of memories which use traditional non-volatile memory cells, such as DRAM cells. This is the case at least because of the following differences resulting from one or more of the features discussed herein as understood by those of skill in the art: 1) Memory devices discussed herein have area that is much smaller than DRAM cells, 2) The manufacturing process for making DRAM cells typically includes forming a trench in the substrate, for example, for forming a capacitor, while memory devices such as memory device 100 may be manufactured without forming a trench.

The speed or access time of memories using an array of memory devices as described herein is much better than that of memories which use traditional non-volatile memory cells. This is the case at least because the electrical resistance of the layers and contacts outside of the memory layer is low, as discussed above with reference to each of the layers and contacts. Memory speed using memory devices as described herein is also improved over traditional memories because large memory systems using memory devices as described herein may be operated without speed crippling Error Correction Code (ECC) techniques as a result, for example, of reliable retention of the memory states of the memory devices. For example, memory systems having Megabyte, Gigabyte, Terabyte storage may be operated without speed crippling ECC techniques.

Though the present invention is disclosed by way of specific embodiments as described above, those embodiments are not intended to limit the present invention. Based on the methods and the technical aspects disclosed above, variations and changes may be made to the presented embodiments by those skilled in the art without departing from the spirit and the scope of the present invention.

What is claimed is:

1. A memory device, comprising:
   a memory layer, wherein the memory layer has a variable resistance;
   an electrode connected to the memory layer, wherein the electrode and the memory layer cooperatively form a heterojunction memory structure; and
   a first barrier layer electrically connected with at least one of the electrode and the memory layer, wherein the first barrier layer comprises a first oxide material and a second oxide material, and wherein the first barrier layer is configured to substantially prevent conduction of ions or vacancies therethrough.

2. The memory device of claim 1, wherein the first oxide material is different from the second oxide material.

3. The memory device of claim 1, wherein the first barrier layer has a resistivity of less than 1 m Ohm-cm.

4. The memory device of claim 1, wherein the first barrier layer has a diffusion constant of oxygen ions of less than about $1 \times 10^{-10}$ cm$^2$/s.

5. The memory device of claim 1, wherein an interface contact is formed at an interface between the first barrier layer and at least one of: the memory layer and the electrode, wherein the first barrier layer does not donate oxygen ions through the interface contact, and wherein the first barrier layer does not accept oxygen ions through the interface contact.

6. The memory device of claim 1, wherein an interface contact is formed at an interface between the first barrier layer and at least one of: the memory layer and the electrode, and wherein the interface contact is ohmic.

7. The memory device of claim 1, wherein an interface contact formed at an interface between the first barrier layer and at least one of: the memory layer and the electrode, and wherein a contact resistance of the interface contact is less than about 1e-11 Ohm m$^2$.

8. The memory device of claim 1, wherein the first oxide material comprises an oxide of a noble metal and the second oxide material comprises an oxide of a transition metal.

9. The memory device of claim 1, wherein the first oxide material has a first crystalline lattice structure and the second oxide material as a second crystalline lattice structure, wherein the first and second crystalline lattice structures are different.

10. The memory device of claim 1, further comprising a template layer electrically connected to the memory layer, wherein a crystalline structure of the memory layer matches a crystalline structure of the template layer.

11. The memory device of claim 1, further comprising a retention layer between the memory layer and the electrode, wherein the retention layer has a variable ionic conductivity, and is configured to selectively resist ionic conduction.

12. The memory device of claim 1, further comprising a second barrier layer, wherein the second barrier layer comprises a third oxide material and a fourth oxide material, wherein the third oxide material is different from the fourth oxide material, wherein the memory layer is between the first and second barrier layers, and wherein the second barrier layer is configured to substantially prevent the conduction of ions or vacancies therethrough.

13. The memory device of claim 12, further comprising a side barrier layer, wherein the first and second barrier layers and the side barrier layer at least partly define a space, wherein the electrode and the memory layer are within the space, and wherein ions of the electrode and the memory layer are confined to the space by the first and second barrier layers and the side barrier layer.

14. A method of manufacturing a memory device, comprising:
   forming a memory layer, wherein the memory layer has a variable resistance;
   connecting an electrode to the memory layer, wherein the electrode and the memory layer cooperatively form a heterojunction memory structure; and
   connecting a first barrier layer to at least one of the electrode and the memory layer, wherein the first barrier layer comprises a first oxide material and a second oxide material, and wherein the first barrier layer is configured to substantially prevent conduction of ions or vacancies therethrough.

15. The method of claim 14, wherein the first oxide material is different from the second oxide material.

16. The method of claim 14, wherein the first barrier layer has a resistivity of less than 1 m Ohm-cm.

17. The method of claim 14, wherein the first barrier layer has a diffusion constant of oxygen ions of less than about $1 \times 10^{-10}$ cm$^2$/s.

18. The method of claim 14, further comprising forming an interface contact at an interface between the first barrier layer and at least one of: the memory layer and the electrode, wherein the first barrier layer does not donate oxygen ions through the interface contact, and wherein the first barrier layer does not accept oxygen ions through the interface contact.

19. The method of claim 14, further comprising forming an interface contact at an interface between the first barrier layer and at least one of: the memory layer and the electrode, wherein the interface contact is ohmic.

20. The method of claim 14, further comprising forming an interface contact at an interface between the first barrier layer and at least one of: the memory layer and the electrode, wherein a contact resistance of the interface contact is less than about 1e-11 Ohm m$^2$.

21. The method of claim 14, wherein the first oxide material comprises an oxide of a noble metal and the second oxide material comprises an oxide of a transition metal.

22. The method of claim 14, wherein the first oxide material has a first crystalline lattice structure and the second oxide material as a second crystalline lattice structure, wherein the first and second crystalline lattice structures are different.

23. The method of claim 14, further comprising electrically contacting a template layer to the memory layer, wherein a crystalline structure of the memory layer matches a crystalline structure of the template layer.

24. The method of claim 14, further comprising forming a retention layer between the memory layer and the electrode, wherein the retention layer has a variable ionic conductivity, and is configured to selectively resist ionic conduction.

25. The method of claim 14, further comprising forming a second barrier layer, wherein the second barrier layer comprises a third oxide material and a fourth oxide material, wherein the third oxide material is different from the fourth oxide material, wherein the memory layer is between the first and second barrier layers, and wherein the second barrier layer is configured to substantially prevent the conduction of ions or vacancies therethrough.

26. The method of claim 25, further comprising forming a side barrier layer, wherein the first and second barrier layers and the side barrier layer at least partly define a space, wherein the electrode and the memory layer are within the space, and wherein ions of the electrode and the memory layer are confined to the space by the first and second barrier layers and the side barrier layer.

* * * * *